(12) United States Patent
Lee et al.

(10) Patent No.: US 10,577,484 B2
(45) Date of Patent: Mar. 3, 2020

(54) COMPOSITIONS AND POLYMER COMPOSITES PREPARED FROM THE SAME

(71) Applicant: SAMSUNG ELECTRONICS CO., LTD., Suwon-si, Gyeonggi-do (KR)

(72) Inventors: Jeong Hee Lee, Seongnam-si (KR); Hyun A Kang, Suwon-si (KR); Eun Joo Jang, Suwon-si (KR); Na Youn Won, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 1366 days.

(21) Appl. No.: 14/680,364

(22) Filed: Apr. 7, 2015

(65) Prior Publication Data

US 2016/0005932 A1   Jan. 7, 2016

(30) Foreign Application Priority Data

Jul. 1, 2014   (KR) .................. 10-2014-0082045

(51) Int. Cl.
| | | |
|---|---|---|
| *H01L 33/50* | (2010.01) | |
| *C09K 11/70* | (2006.01) | |
| *C09K 11/02* | (2006.01) | |
| *C08K 3/22* | (2006.01) | |
| *C08K 5/56* | (2006.01) | |
| *C08K 5/1535* | (2006.01) | |
| *C08K 5/092* | (2006.01) | |
| *C08K 3/08* | (2006.01) | |
| *C08K 5/098* | (2006.01) | |
| *C09K 11/56* | (2006.01) | |

(52) U.S. Cl.
CPC .................. *C08K 5/56* (2013.01); *C08K 3/08* (2013.01); *C08K 3/22* (2013.01); *C08K 5/092* (2013.01); *C08K 5/098* (2013.01); *C08K 5/1535* (2013.01); *C09K 11/02* (2013.01); *C09K 11/025* (2013.01); *C09K 11/565* (2013.01); *C09K 11/70* (2013.01); *C09K 11/703* (2013.01); *C08K 2003/0893* (2013.01); *C08K 2003/2296* (2013.01)

(58) Field of Classification Search
CPC ... H01L 33/502; C09K 11/025; C09K 11/703; C08K 3/22; C08K 3/08; C08K 5/1535; C08K 5/092; C08K 5/098; C08K 5/56; C08K 2003/2296; C08K 2003/0893
See application file for complete search history.

(56) References Cited

U.S. PATENT DOCUMENTS

| | | |
|---|---|---|
| 5,371,181 A | 12/1994 | Glaser et al. |
| 8,080,229 B2 | 12/2011 | Shih et al. |
| 8,187,726 B2 | 5/2012 | Sasaki et al. |
| 8,481,670 B2 | 7/2013 | Kumar et al. |
| 2007/0149660 A1 | 6/2007 | Kumar et al. |
| 2013/0072586 A1 | 3/2013 | Kumar et al. |
| 2013/0303721 A1* | 11/2013 | Jang .................. C08G 18/3876 528/59 |
| 2014/0011901 A1 | 1/2014 | Kumar et al. |
| 2015/0031782 A1* | 1/2015 | Bowman ................ C08F 220/18 522/33 |

FOREIGN PATENT DOCUMENTS

| | | |
|---|---|---|
| KR | 100619379 B1 | 8/2006 |
| KR | 100809366 B1 | 2/2008 |

OTHER PUBLICATIONS

Charles E. Hoyle, et al., "Thiol-Enes: Chemistry of the Past with Promise for the Future", Journal of Polymer Science: Part A: Polymer Chemistry, vol. 42, 5301-5338 (2004).

* cited by examiner

*Primary Examiner* — Robert D Harlan
(74) *Attorney, Agent, or Firm* — Cantor Colburn LLP

(57) ABSTRACT

A composition including: a monomer mixture including a first monomer having at least two thiol groups at its terminal end and a second monomer having at least two carbon-carbon unsaturated bond-containing groups at its terminal end; and at least one additive selected from a zinc compound, an indium compound, ascorbic acid or a salt thereof, citric acid or a salt thereof, a tocopherol, and a tocotrienol.

17 Claims, 6 Drawing Sheets

COMPOSITIONS AND POLYMER COMPOSITES PREPARED FROM THE SAME

CROSS-REFERENCE TO RELATED APPLICATION

This application claims priority to Korean Patent Application No. 10-2014-0082045 filed in the Korean Intellectual Property Office on Jul. 1, 2014, and all the benefits accruing therefrom under 35 U.S.C. § 119, the content of which is incorporated herein in its entirety by reference.

BACKGROUND

1. Field

A composition and a polymer composite prepared from the same are disclosed.

2. Description of the Related Art

Light emitting particles may be dispersed in an organic or inorganic host matrix, and the resulting composite may be applied to various display devices. For example, semiconductor nanocrystals, also known as quantum dots, may be dispersed in a host matrix of a polymer or an inorganic material, and the resulting entity may be used as a photoconversion layer in a light emitting diode (LED). Recently, a quantum dot enhancement film (QDEF) obtained by dispersing the quantum dots in a polymer film has drawn attention as a tool capable of improving image quality of a liquid crystal display.

On the other hand, the semiconductor nanocrystals have low luminous efficiency and brightness due to oxidation. However, when a polymer obtained from a mixture of a thiol monomer and a monomer having a carbon-carbon unsaturated bond (hereinafter referred to as a thiol-ene system) is used as a host matrix for the semiconductor nanocrystals, degradation of the luminous efficiency and luminance may be decreased. However, the thiol-ene system generally has poor storage stability.

Therefore, there remains a need in a thiol-ene a thiol-ene system having improved storage stability

SUMMARY

An embodiment provides a thiol-ene system having improved storage stability.

Another embodiment provides a polymer composite prepared from the thiol-ene system.

Yet another embodiment provides a film including the polymer composite prepared from the thiol-ene system and an electronic device including the same.

In an embodiment, a composition includes: a monomer mixture including a first monomer having at least two thiol groups at its terminal end and a second monomer having at least two carbon-carbon unsaturated bond-containing groups at its end; and at least one additive selected from a zinc compound, an indium compound, ascorbic acid or a salt thereof, citric acid or a salt thereof, a tocopherol, and a tocotrienol.

The composition may further include a light emitting particle selected from a Group II-VI compound semiconductor nanocrystal, a Group III-V compound semiconductor nanocrystal, a Group IV-VI compound semiconductor nanocrystal, and a Group IV compound semiconductor nanocrystal.

The composition may further include a light emitting particle selected from at least one of a metal nanocrystal, a metal oxide nanocrystal, a phosphor, and a pigment.

The first monomer may be represented by Chemical Formula 1.

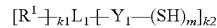  Chemical Formula 1

In Chemical Formula 1, $R^1$ is selected from hydrogen; a substituted or unsubstituted C1 to C30 linear or branched alkyl group; a substituted or unsubstituted C6 to C30 aryl group; a substituted or unsubstituted C7 to C30 arylalkyl group; a substituted or unsubstituted C3 to C30 heteroaryl group; a substituted or unsubstituted C4 to C30 heteroarylalkyl group; a substituted or unsubstituted C3 to C30 cycloalkyl group; a substituted or unsubstituted C3 to C30 heterocycloalkyl group; a C1 to C10 alkoxy group; a hydroxy group; $-NH_2$; $-NRR'$, wherein R and R' are independently hydrogen or a C1 to C30 linear or branched alkyl group; an isocyanate group; a halogen; $-ROR'$, wherein R is a substituted or unsubstituted C1 to C20 alkylene group and R' is hydrogen or a C1 to C20 linear or branched alkyl group; a-RC(=O)X, wherein R is a substituted or unsubstituted alkylene group and X is a halogen; $-C(=O)OR'$, wherein R' is hydrogen or a C1 to C20 linear or branched alkyl group; $-CN$; and $-C(=O)ONRR'$, wherein R and R' are independently hydrogen or a C1 to C20 linear or branched alkyl group, $L_1$ is selected from a carbon atom, a substituted or unsubstituted C1 to C30 alkylene group, a substituted or unsubstituted C6 to C30 cycloalkylene group, a substituted or unsubstituted C6 to C30 arylene group, or a substituted or unsubstituted C6 to C30 heteroarylene group, and a C1 to C30 alkylene group, wherein at least one non-adjacent $-CH_2-$ group may be replaced by $-SO_2-$, CO, $-O-$, $-S-$, $-SO-$, $-C(=O)O-$, $-C(=O)NR-$, wherein R is hydrogen or a C1 to C10 alkyl group), or a combination thereof, $Y_1$ is selected from a single bond; a substituted or unsubstituted C1 to C30 alkylene group; a substituted or unsubstituted C2 to C30 alkenylene group; and a substituted C1 to C30 alkylene group or a C2 to C30 alkenylene group, wherein at least one $-CH_2-$ group is replaced by $-S(=O)_2-$, $-C(=O)-$, $-O-$, $-S-$, $-S(=O)-$, $-C(=O)O-$, $-C(=O)NR-$, wherein R is hydrogen or a C1 to C10 linear or branched alkyl group, $-NR-$, wherein R is hydrogen or a C1 to C10 linear or branched alkyl group, or a combination thereof, m is an integer of 1 or more, k1 is 0 or an integer of 1 or more, k2 is an integer of 1 or more, wherein the sum of m and k2 is an integer of 3 or more, provided that m does not exceed the valence of $Y_1$, and provided that the sum of k1 and k2 does not exceed the valence of $L_1$.

The second monomer may be represented by Chemical Formula 2.

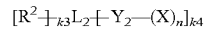  Chemical Formula 2

In Chemical Formula 2,

X is selected from an aliphatic organic group including a carbon-carbon double bond or a carbon-carbon triple bond, an aromatic organic group including a carbon-carbon double bond or a carbon-carbon triple bond, and an alicyclic organic group including a carbon-carbon double bond or a carbon-carbon triple bond, $R^2$ is selected from hydrogen; a substituted or unsubstituted C1 to C30 linear or branched alkyl group; a substituted or unsubstituted C6 to C30 aryl group; a substituted or unsubstituted C7 to C30 arylalkyl group; a substituted or unsubstituted C3 to C30 heteroaryl group; a substituted or unsubstituted C4 to C30 heteroarylalkyl group; a substituted or unsubstituted C3 to C30 cycloalkyl group; a substituted or unsubstituted C3 to C30 heterocycloalkyl group; a C1 to C10 alkoxy group; a hydroxy group; $NH_2$; —NRR', wherein R and R' are independently hydrogen or a C1 to C30 linear or branched alkyl group; an isocyanate group; a halogen; —ROR', wherein R is a substituted or unsubstituted C1 to C20 alkylene group and R' is hydrogen or a C1 to C20 linear or branched alkyl group; —RC(=O)X, wherein R is a substituted or unsubstituted alkylene group and X is a halogen; —C(=O)OR', wherein R' is hydrogen or a C1 to C20 linear or branched alkyl group; —CN; and —C(=O)ONRR', wherein R and R' are independently hydrogen or a C1 to C20 linear or branched alkyl group, $L_2$ is selected from a carbon atom, a substituted or unsubstituted C1 to C30 alkylene group, a substituted or unsubstituted C6 to C30 cycloalkylene group, a substituted or unsubstituted C6 to C30 arylene group, and a substituted or unsubstituted C3 to C30 heteroarylene group, $Y_2$ is selected from a single bond; a substituted or unsubstituted C1 to C30 alkylene group; a substituted or unsubstituted C2 to C30 alkenylene group; or a substituted C1 to C30 alkylene group or a C2 to C30 alkenylene group, wherein at least one —$CH_2$— group is replaced by —S(=O)$_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, or a combination thereof, n is an integer of 1 or more, k3 is an integer of 0 or more, k4 is an integer of 1 or more, and wherein the sum of n and k4 is an integer of 3 or more, provided that n does not exceed the valence of $Y_2$, and provided that the sum of k3 and k4 does not exceed the valence of $L_2$.

The first monomer of Chemical Formula 1 may include a monomer of Chemical Formula 1-1.

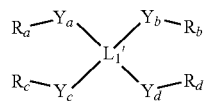

Chemical Formula 1-1

In Chemical Formula 1-1,

L1' is selected from carbon; a substituted or unsubstituted C6 to C30 tetravalent arene-derived group; a substituted or unsubstituted C3 to C30 tetravalent heteroarene-derived group; a substituted or unsubstituted C3 to C30 tetravalent cycloalkane-derived group; and a substituted or unsubstituted C3 to C30 tetravalent heterocycloalkane-derived group, each of $Y_a$ to $Y_d$ are independently a single bond; a substituted or unsubstituted C1 to C30 alkylene group; a substituted or unsubstituted C2 to C30 alkenylene group; or a substituted C1 to C30 alkylene group or a C2 to C30 alkenylene group, wherein at least one —$CH_2$— group is replaced by —S(=O)$_2$—, —C(=O)—, —O—, —S—, —S(=O)—, —C(=O)O—, —C(=O)NR—, wherein R is hydrogen or a C1 to C10 linear or branched alkyl group, imine —NR—, wherein R is hydrogen or a C1 to C10 linear or branched alkyl group, or a combination thereof, and $R_a$ to $R_d$ are each independently selected from $R^1$ of Chemical Formula 1 or SH, provided that at least two groups selected from $R_a$ to $R_d$ are SH.

The first monomer of Chemical Formula 1 may be at least one selected from trimethylolpropane tris(3-mercaptopropionate) of Chemical Formula 1-2, pentaerythritol tetrakis(3-mercaptopropionate) of Chemical Formula 1-3, pentaerythritol tetrakis(2-mercaptoacetate of Chemical Formula 1-4, tris[2-(3-mercaptopropinonyloxy)alkyl]isocyanurate of Chemical Formula 1-5, a compound of Chemical Formula 1-6, a compound of Chemical Formula 1-7, and a compound of Chemical Formula 1-8.

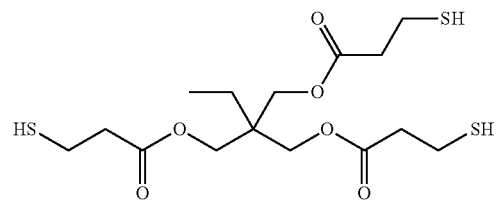

Chemical Formula 1-2

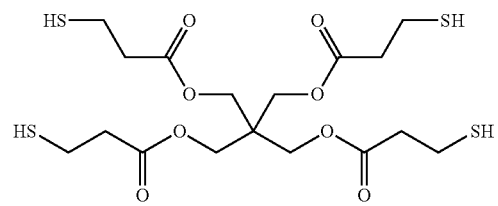

Chemical Formula 1-3

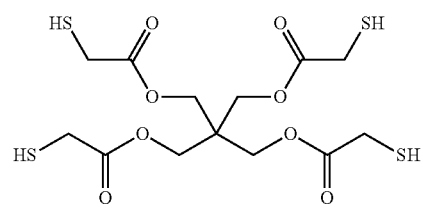

Chemical Formula 1-4

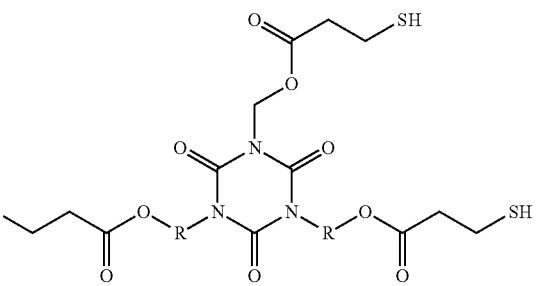

Chemical Formula 1-5

In Chemical Formula 1-5, R is a substituted or unsubstituted C1 to C10 alkylene.

Chemical Formula 1-6

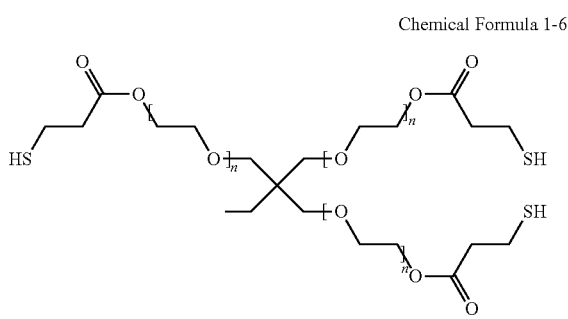 [SMILES: CCC(COCCOC(=O)CCS)(COCCOC(=O)CCS)COCCOC(=O)CCS]

Herein, n is an integer of 1 to 20.

Chemical Formula 1-7

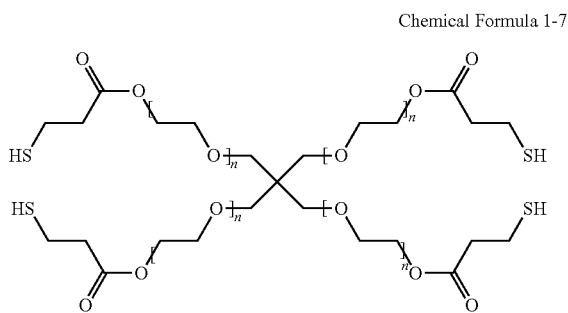 [SMILES: O=C(CCS)OCCOCC(COCCOC(=O)CCS)(COCCOC(=O)CCS)COCCOC(=O)CCS]

Herein, n is an integer of 1 to 20.

Chemical Formula 1-8

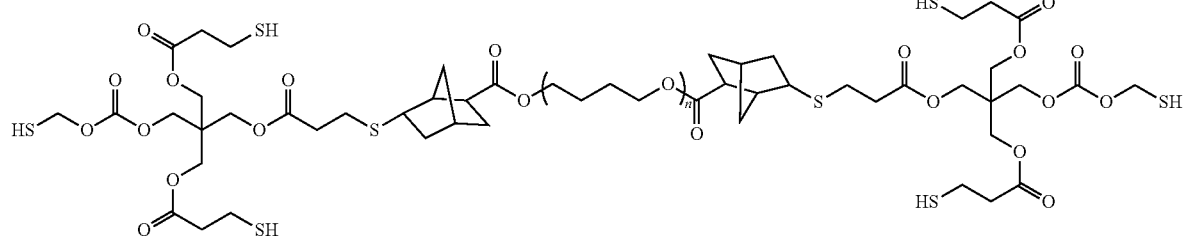

Herein, n is an integer of 1 to 20.

In Chemical Formula 2, X is selected from an acrylate group; a methacrylate group; a C2 to C30 alkenyl group; a C2 to C30 alkynyl group; a substituted or unsubstituted C3 to C30 alicyclic organic group having a carbon-carbon double bond or a carbon-carbon triple bond in the ring; a substituted or unsubstituted C3 to C30 heterocycloalkyl group having a carbon-carbon double bond or a carbon-carbon triple bond in the ring; a C3 to C30 alicyclic organic group substituted with a C2 to C30 alkenyl group or a C2 to C30 alkynyl group; and a C3 to C30 heterocycloalkyl group substituted with a C2 to C30 alkenyl group or a C2 to C30 alkynyl group.

The substituted or unsubstituted C3 to C30 alicyclic organic group having a carbon-carbon double bond or a carbon-carbon triple bond in the ring may be at least one selected from a norbornene group, a maleimide group, a nadimide group, and a tetrahydrophthalimide group.

The second monomer may be at least one selected from a C4 to C100 diallyl compound, a C4 to C100 triallyl compound, a C4 to C100 diallyl ether compound, a C4 to C100 triallyl ether compound, a C4 to C100 di(meth)acrylate compound, and a C4 to C100 tri(meth)acrylate compound, a divinyl ether compound.

In Chemical Formula 2, $L^2$ may be selected from a group including a pyrrolidine moiety, a tetrahydrofuran moiety, a pyridine moiety, a pyrimidine moiety, a piperidine moiety, a triazine moiety, and an isocyanurate moiety.

The second monomer of Chemical Formula 2 may be selected from a compound represented by Chemical Formula 2-1, Chemical Formula 2-2, and Chemical Formula 2-3.

Chemical Formula 2-1

Chemical Formula 2-2

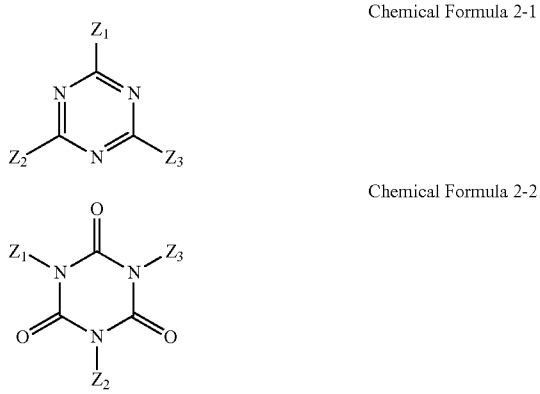

In Chemical Formulae 2-1 and 2-2,
each of $Z_1$ to $Z_3$ independently corresponds to *—$Y_2$—$X_n$ as defined in Chemical Formula 2.

Chemical Formula 2-3

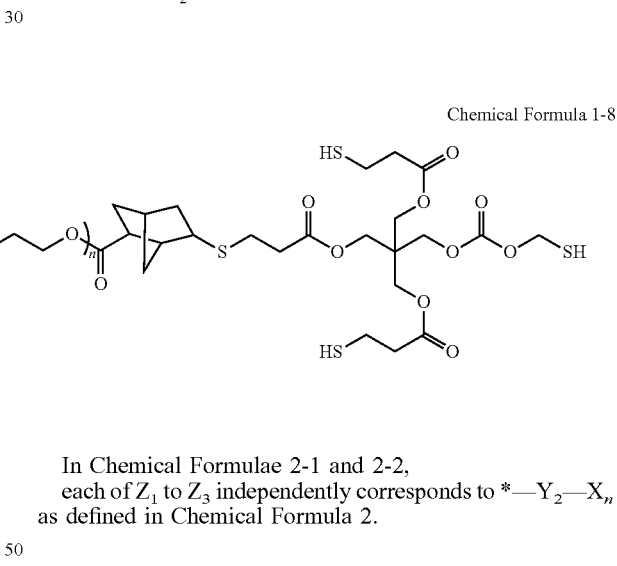

In Chemical Formula 2-3,
$L_2'$ is selected from carbon; a substituted or unsubstituted C1 to C30 tetravalent alkane-derived group; a substituted or unsubstituted C2 to C30 tetravalent alkene-derived group; a C1 to C30 tetravalent alkane-derived group, wherein at least one —$CH_2$— group is replaced by —S(=O)$_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, a C6 to C10 cycloalkylene group, or a combination thereof; a C2 to C30 tetravalent alkane-derived group, wherein at least one —CH$_2$— group is replaced by —S(=O)$_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, a C6 to C10 cycloalkylene group, or a combination thereof; a substituted or unsubstituted C6 to C30 tetravalent arene-derived group; a substituted or unsubstituted C3 to C30 tetravalent heteroarene-derived group; a substituted or unsubstituted C3 to C30 tetravalent cycloalkane-derived group; and a substituted or unsubstituted C3 to C30 tetravalent heterocycloalkane-derived group, each of $Y_a$ to $Y_d$ are independently selected from a single bond; a substituted or unsubstituted C1 to C30 alkylene group; a substituted or unsubstituted C2 to C30 alkenylene group; or a C1 to C30 alkylene group or a C2 to C30 alkenylene group, wherein at least one —CH$_2$— group is replaced by —S(=O)$_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group or a combination thereof, and each of $R'_a$ to $R'_d$ independently corresponds to $R^2$ or X of Chemical Formula 2, provided that at least two of $R'_a$ to $R'_d$ are X of Chemical Formula 2.

The second monomer may include at least one selected from a compound of Chemical Formula 2-4, a compound of Chemical Formula 2-5, a compound of Chemical Formula 2-6, a compound of Chemical Formula 2-7, a compound of Chemical Formula 2-8, a compound of Chemical Formula 2-9, a compound of Chemical Formula 2-10, a compound of Chemical Formula 2-11, a compound of Chemical Formula 2-12, a compound of Chemical Formula 2-13, a compound of Chemical Formula 2-14, and a compound of Chemical Formula 2-15.

Chemical Formula 2-4

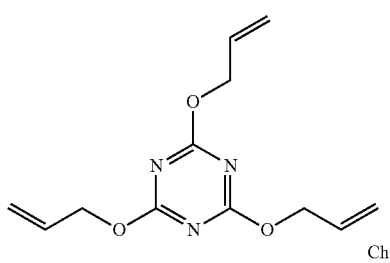

Chemical Formula 2-5

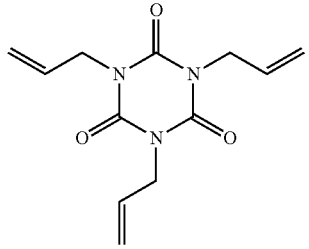

Chemical Formula 2-6

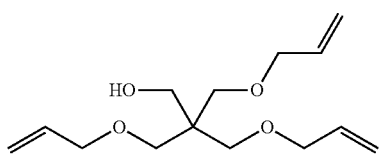

Chemical Formula 2-7

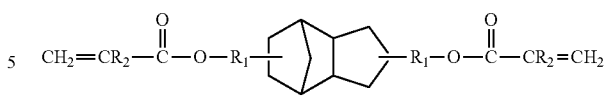

In Chemical Formula 2-7,
$R_1$ is selected from a C1 to C20 alkylene group and a C1 to C20 alkylene group, wherein at least one —CH$_2$— group is replaced by —S(=O)$_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, or a combination thereof, and $R_2$ is selected from hydrogen and a methyl group.

Chemical Formula 2-8

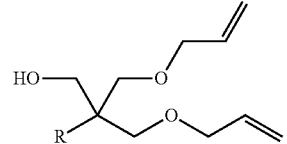

In Chemical Formula 2-8, R is a C1 to C10 alkyl group.

Chemical Formula 2-9

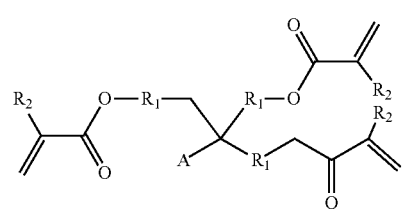

In Chemical Formula 2-9,
A is a C1 to C10 alkyl group or a hydroxy group,
$R_1$ is selected from a single bond, a C1 to C20 alkylene group and a C1 to C20 alkylene, wherein at least one —CH$_2$— group is replaced by —S(=O)$_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, or a combination thereof, and $R_2$ is selected from hydrogen and a methyl group.

Chemical Formula 2-10

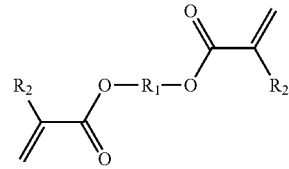

In Chemical Formula 2-10,
$R_1$ is selected from a C1 to C20 alkylene and a C1 to C20 alkylene, wherein at least —CH$_2$— group is replaced by —S(=O)$_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, or a combination thereof, and R$_2$ is selected from hydrogen and a methyl group.

Chemical Formula 2-11

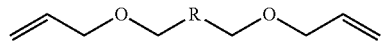

In Chemical Formula 2-11,

R is selected from a single bond and a C1 to C20 alkylene or a C1 to C20 alkylene, wherein at least one —CH$_2$— group is replaced by —S(=O)$_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, or a combination thereof.

Chemical Formula 2-12

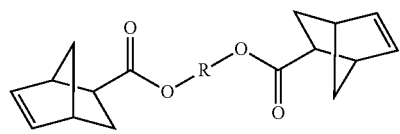

In Chemical Formula 2-12,

R is a C1 to C20 alkylene, or a C1 to C20 alkylene, wherein at least one —CH$_2$— group is replaced by —S(=O)$_2$—, —C(=O)—, —O—, S—), —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, or a combination thereof.

Chemical Formula 2-13

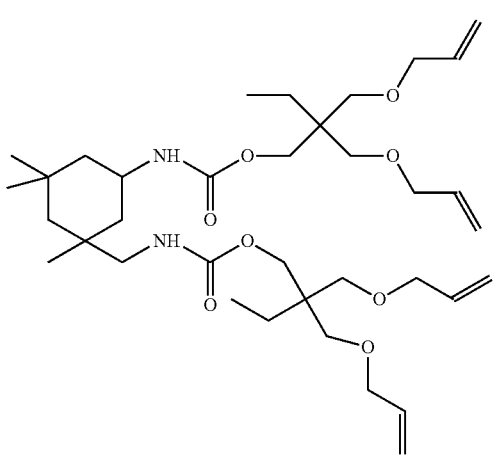

Chemical Formula 2-14

Chemical Formula 2-15

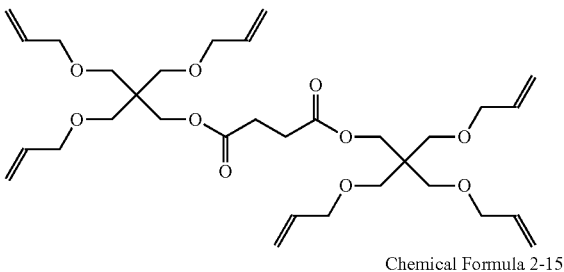

The monomer mixture may further include at least one of a third monomer having one thiol group at its terminal end and a fourth monomer having one carbon-carbon unsaturated bond-containing group at its terminal end, or a combination thereof.

The zinc compound may include at least one selected from a zinc inorganic acid salt including a counter ion of pKa of at least 3, a zinc organic acid salt, a zinc halide, a zinc oxide, a zinc metal, and a dialkyl zinc, and the indium compound may include at least one selected from an indium inorganic acid salt including a counter ion of pKa of at least 3, an indium organic acid salt, an indium halide, an indium oxide, an indium metal, and a dialkyl indium.

The composition may include the additive in an amount of about $10^{-6}$ parts by weight to about 10 parts by weight based on 100 parts by weight of the monomer mixture.

The composition may include the light emitting particle in an amount of about 0.1 to about 20 parts by weight based on 100 parts by weight of the monomer mixture.

In the monomer mixture, the first monomer and the second monomer may be present in such an amount that a mole ratio between the thiol group of the first monomer and the carbon-carbon unsaturated bond of the second monomer may be about 1:about 0.75 to about 3, for example, about 1:about 1.1 to about 2, or about 1:about 1.5 to about 1.8.

In another embodiment, the polymer composite includes:
a thiol-ene cross-linking polymerization product of a first monomer having at least two thiol groups at its terminal end and a second monomer having at least two carbon-carbon unsaturated bond-containing groups at its terminal end; and
at least one additive selected from a zinc compound, an indium compound, ascorbic acid or a salt thereof, citric acid or a salt thereof, a tocopherol, and a tocotrienol.

The polymer composite may further include a light emitting particle selected from a Group II-VI compound semiconductor nanocrystal, a Group III-V compound semiconductor nanocrystal, a Group IV-VI compound semiconductor nanocrystal, and a Group IV compound semiconductor nanocrystal.

The polymer composite may further include at least one light emitting particle selected from a metal nanocrystal, a metal oxide nanocrystal, a phosphor, and a pigment.

The first monomer may be represented by Chemical Formula 1.

 Chemical Formula 1

In Chemical Formula 1, $R^1$ is selected from hydrogen; a substituted or unsubstituted C1 to C30 linear or branched alkyl group; a substituted or unsubstituted C6 to C30 aryl group; a substituted or unsubstituted C7 to C30 arylalkyl group; a substituted or unsubstituted C3 to C30 heteroaryl group; a substituted or unsubstituted C4 to C30 heteroarylalkyl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; NRR', wherein R and R' are independently hydrogen or a C1 to C30 linear or branched alkyl group; an isocyanate group; a halogen; —ROR', wherein R is a substituted or unsubstituted C1 to C20 alkylene group and R' is hydrogen or a C1 to C20 linear or branched alkyl group; —RC(=O)X, wherein R is a substituted or unsubstituted alkylene group and X is a halogen; —C(=O)OR', wherein R' is hydrogen or a C1 to C20 linear or branched alkyl group; —CN; and —C(=O)ONRR', wherein R and R' are independently hydrogen or a C1 to C20 linear or branched alkyl group, $L_1$ is selected from a carbon atom, a substituted or unsubstituted C1 to C30 alkylene group, a substituted or unsubstituted C6 to C30 cycloalkylene group, a substituted or unsubstituted C6 to C30 arylene group, or a substituted or unsubstituted C6 to C30 heteroarylene group, and a C1 to C30 alkylene group, wherein at least one non-adjacent —$CH_2$— group is replaced by —$SO_2$—, CO, —O—, —S—, —SO—, —C(=O)O—, —C(=O)NR—, wherein R is hydrogen or a C1 to C10 alkyl group, or a combination thereof, $Y_1$ is selected from a single bond; a substituted or unsubstituted C1 to C30 alkylene group; a substituted or unsubstituted C2 to C30 alkenylene group; and a substituted C1 to C30 alkylene group or a C2 to C30 alkenylene group, wherein at least one —$CH_2$— group is replaced by S(=O)$_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, or a combination thereof, m is an integer of 1 or more, k1 is 0 or an integer of 1 or more, k2 is an integer of 1 or more, wherein the sum of m and k2 is an integer of 3 or more, provided that m does not exceed the valence of $Y_1$, and provided that the sum of k1 and k2 does not exceed the valence of $L_1$.

The second monomer may be represented by Chemical Formula 2.

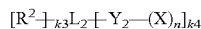 Chemical Formula 2

In Chemical Formula 2,

X is selected from an aliphatic organic group including a carbon-carbon double bond or a carbon-carbon triple bond, an aromatic organic group including a carbon-carbon double bond or a carbon-carbon triple bond, and an alicyclic organic group including a carbon-carbon double bond or a carbon-carbon triple bond, $R^2$ is selected from hydrogen; a substituted or unsubstituted C1 to C30 linear or branched alkyl group; a substituted or unsubstituted C6 to C30 aryl group; a substituted or unsubstituted C7 to C30 arylalkyl group; a substituted or unsubstituted C3 to C30 heteroaryl group; a substituted or unsubstituted C4 to C30 heteroarylalkyl group; a substituted or unsubstituted C3 to C30 cycloalkyl group; a substituted or unsubstituted C3 to C30 heterocycloalkyl group; a C1 to C10 alkoxy group; a hydroxy group; $NH_2$; —NRR', wherein R and R' are independently hydrogen or a C1 to C30 linear or branched alkyl group; an isocyanate group; a halogen; —ROR', wherein R is a substituted or unsubstituted C1 to C20 alkylene group and R' is hydrogen or a C1 to C20 linear or branched alkyl group; —RC(=O)X, wherein R is a substituted or unsubstituted alkylene group and X is a halogen; —C(=O)OR', wherein R' is hydrogen or a C1 to C20 linear or branched alkyl group; —CN; and —C(=O)ONRR', wherein R and R' are independently hydrogen or a C1 to C20 linear or branched alkyl group, $L_2$ is selected from a carbon atom, a substituted or unsubstituted C1 to C30 alkylene group, a substituted or unsubstituted C6 to C30 cycloalkylene group, a substituted or unsubstituted C6 to C30 arylene group, and a substituted or unsubstituted C3 to C30 heteroarylene group, $Y_2$ is selected from a single bond; a substituted or unsubstituted C1 to C30 alkylene group; a substituted or unsubstituted C2 to C30 alkenylene group; and a substituted C1 to C30 alkylene group or a C2 to C30 alkenylene group, wherein at least one —$CH_2$— group is replaced by —S(=O)$_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, or a combination thereof, n is an integer of 1 or more, k3 is an integer of 0 or more, k4 is an integer of 1 or more, wherein the sum of n and k4 is an integer of 3 or more, provided that n does not exceed the valence of $Y_2$, and provided that the sum of k3 and k4 does not exceed the valence of $L_2$.

The thiol-ene cross-linking polymerization product may be a polymerization product of a monomer mixture further including at least one of a third monomer having one thiol group at its terminal end and a fourth monomer having one carbon-carbon unsaturated bond-containing group at its terminal end.

The zinc compound may include at least one selected from a zinc inorganic acid salt including a counter ion with pKa of at least 3, a zinc organic acid salt, a zinc halide, a zinc oxide, a zinc metal, and a dialkyl zinc, and the indium compound may include at least one selected from an indium inorganic acid salt including a counter ion with pKa of at least 3, an indium organic acid salt, an indium halide, an indium oxide, an indium metal, and a dialkyl indium.

Another embodiment provides a film including the polymer composite.

The film may further include a barrier film contacting the surface of the composite.

In yet another embodiment, an electronic device includes the film.

The electronic device may be at least one selected from a display, a light emitting device, a memory device, a laser device, and a solar cell.

The light emitting device may include a light source, wherein the film is positioned so that the film may transmit light emitted from the light source.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
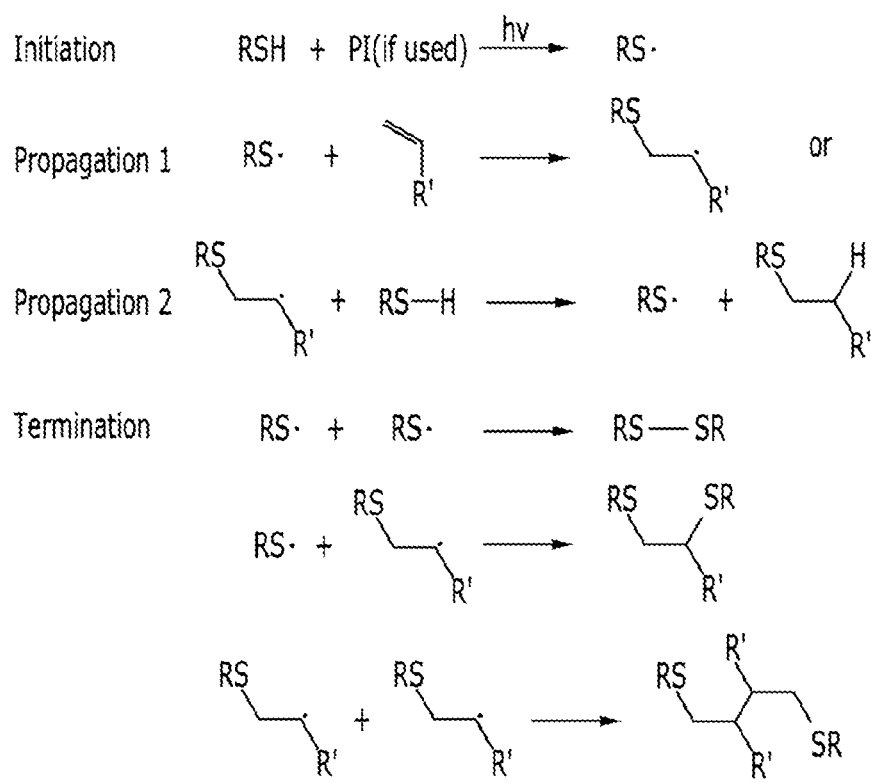
FIG. 1 is a diagram showing a polymerization-related reaction scheme in a thiol-ene system.

This disclosure will be described more fully hereinafter in the following detailed description, in which some but not all embodiments of this disclosure are described. This disclosure may be embodied in many different forms and is not be construed as limited to the embodiments set forth herein; rather, these embodiments are provided so that this disclosure will fully convey the scope of the disclosure to those skilled in the art. Thus, in some exemplary embodiments, well known technologies are not specifically explained to avoid ambiguous understanding of the present inventive concept. Accordingly, the exemplary embodiments are merely described below, by referring to the figures, to explain aspects of the present inventive concept. Expressions such as "at least one of," when preceding a list of elements, modify the entire list of elements and do not modify the individual elements of the list. Unless otherwise defined, all terms used in the specification (including technical and scientific terms) may be used with meanings commonly understood by a person having ordinary knowledge in the art to which this invention belongs. Further, unless explicitly defined to the contrary, the terms defined in a generally-used dictionary should be interpreted as having a meaning that is consistent with their meaning in the context of the relevant art and the present disclosure, and are not ideally or excessively interpreted. In addition, unless explicitly described to the contrary, the word "comprise" and variations such as "comprises" or "comprising", and the word "include" and variations such as "includes" or "including", when used in this specification, specify the presence of stated features, regions, integers, steps, operations, elements, and/or components, but do not preclude the presence or addition of one or more other features, regions, integers, steps, operations, elements, components, and/or groups thereof. Therefore, the above words will be understood to imply the inclusion of stated elements but not the exclusion of any other elements.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As stated above, unless specifically described to the contrary, a singular form includes a plural form.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, the term "substituted" refers to a compound wherein at least one of hydrogen atoms thereof is substituted with a substituent selected from a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)

H), a carbamoyl group (—C(O)NH$_2$), a thiol group (—SH), an ester group (—C(=O)OR wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), and a phosphoric acid group (—PO$_3$H$_2$) or a salt thereof (—PO$_3$MH or —PO$_3$M$_2$, wherein M is an organic or inorganic cation).

As used herein, the term "monovalent organic functional group" refers to a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, the term "monovalent to trivalent metal salt" refers to a cation of an alkali metal or an alkaline-earth metal, or a cation of a transition metal.

As used herein, the term "hetero" refers to inclusion of one to three heteroatoms selected from the group consisting of N, O, S, Si, and P.

As used herein, the term "alkyl group" may refer to a group derived from a straight or branched chain saturated aliphatic hydrocarbon having the specified number of carbon atoms and having a valence of at least one.

As used herein, the term "alkoxy group" may refer to "alkyl-O—", wherein the term "alkyl" has the same meaning as described above.

As used herein, the term "alkenyl group" may refer to a straight or branched chain, monovalent hydrocarbon group having at least one carbon-carbon double bond.

As used herein, the term "alkynyl group" may refer to a straight or branched chain, monovalent hydrocarbon group having at least one carbon-carbon triple bond.

As used herein, the term "cycloalkyl group" may refer to a monovalent group having one or more saturated rings in which all ring members are carbon.

As used herein, the term "aryl", which is used alone or in combination, may refer to an aromatic hydrocarbon containing at least one ring and having the specified number of carbon atoms. The term "aryl" may be construed as including a group with an aromatic ring fused to at least one cycloalkyl ring.

The term "heteroaryl group" may refer to an aryl group including carbon and 1 to 3 heteroatoms selected from the group consisting of N, O, S, and P as ring atoms.

The term "arylalkyl group" may refer to a substituted or unsubstituted aryl group covalently linked to an alkyl group that is linked to a compound.

The term "heteroarylalkyl group" may refer to a substituted or unsubstituted heteroaryl group covalently linked to an alkyl group that is linked to a compound.

As used herein, the term "alkylene group" may refer to a straight or branched saturated aliphatic hydrocarbon group having a valence of at least two, optionally substituted with one or more substituents where indicated, provided that the valence of the alkylene group is not exceeded.

As used herein, the term "alkenylene group" may refer to a straight or branched aliphatic hydrocarbon group having a valence of at least two, having at least one carbon-carbon double bond, optionally substituted with one or more substituents where indicated, provided that the valence of the alkylene group is not exceeded.

As used herein, the term "cycloalkylene group" may refer to a cyclic hydrocarbon group having a valence of at least two, optionally substituted with one or more substituents where indicated, provided that the valence of the cycloalkylene group is not exceeded.

As used herein, the term "arylene group" may refer to a functional group having a valence of at least two obtained by removal of two hydrogens in an aromatic ring, optionally substituted with one or more substituents where indicated, provided that the valence of the alkylene group is not exceeded.

As used herein, the term "heteroarylene group" may refer to a functional group having a valence of at least two obtained by removal of two hydrogens in an aromatic ring, containing one to three heteroatoms selected from the group consisting of N, O, S, Si, and P as ring-forming elements, optionally substituted with one or more substituents where indicated, provided that the valence of the alkylene group is not exceeded.

As used herein, the term "aliphatic organic group" refers to a C1 to C30 linear or branched alkyl group, the term "aromatic organic group" refers to a C6 to C30 aryl group or a C2 to C30 heteroaryl group, and the term "alicyclic organic group" refers to a C3 to C30 cycloalkyl group, a C3 to C30 cycloalkenyl group, or a C3 to C30 cycloalkynyl group. As used herein, the term "carbon-carbon unsaturated bond-containing substituent" refers to a C2 to C20 alkenyl group including at least one carbon-carbon double bond, a C2 to C20 alkynyl group including at least one carbon-carbon triple bond, a C4 to C20 cycloalkenyl group including at least one carbon-carbon double bond in the ring, or a C4 to C20 cycloalkynyl group including at least one carbon-carbon triple bond in the ring.

As used herein, the term "(meth)acrylate" refers to acrylate and/or methacrylate.

In an embodiment, a composition includes a monomer mixture of a first monomer having at least two thiol (—SH) groups at its terminal end and a second monomer having at least two carbon-carbon unsaturated bond-containing groups at its terminal end; and at least one an additive selected from a zinc compound, an indium compound, ascorbic acid or a salt thereof, citric acid or a salt thereof, a tocopherol, and a tocotrienol.

The first monomer may be represented by the following Chemical Formula 1.

$$[R^1 \!-\!]_{k1} L_1 \!-\![ Y_1 \!-\! (SH)_m ]_{k2}$$  Chemical Formula 1

In Chemical Formula 1, the definitions of $R^1$, $L_1$, $Y_1$, m, k1, and k2 are the same as set forth above.

The first monomer of Chemical Formula 1 may include a monomer of the following Chemical Formula 1-1.

Chemical Formula 1-1

$$R_a\!-\!Y_a \quad Y_b\!-\!R_b$$
$$\diagdown \!\! L_1' \!\! \diagup$$
$$R_c\!-\!Y_c \quad Y_d\!-\!R_d$$

In Chemical Formula 1-1, the definitions of $L_1'$, $Y_a$ to $Y_d$, and $R_a$ to $R_d$ are the same as set forth above.

For example, the first monomer of Chemical Formula 1 may be at least one selected from trimethylolpropane tris(3-mercaptopropionate) of the following Chemical Formula 1-2, pentaerythritol tetrakis(3-mercaptopropionate) of the following Chemical Formula 1-3, pentaerythritol tetrakis(2-mercaptoacetate) of the following Chemical Formula 1-4, tris[2-(3-mercaptopropionyloxyl)alkyl]isocyanurate of the following Chemical Formula 1-5, pentaerythritol tetrakis(3- mercaptobutylate, trimethylolpropane tris(3-mercaptopropionate) (3T), tris[2-(3-mercaptopropinonyloxy)ethyl]isocyanurate (3TI), a compound of the following Chemical Formula 1-6, a compound of the following Chemical Formula 1-7, and a compound of the following Chemical Formula 1-8, but is not limited thereto.

In Chemical Formula 1-5, R is a substituted or unsubstituted C1 to C10 alkylene.

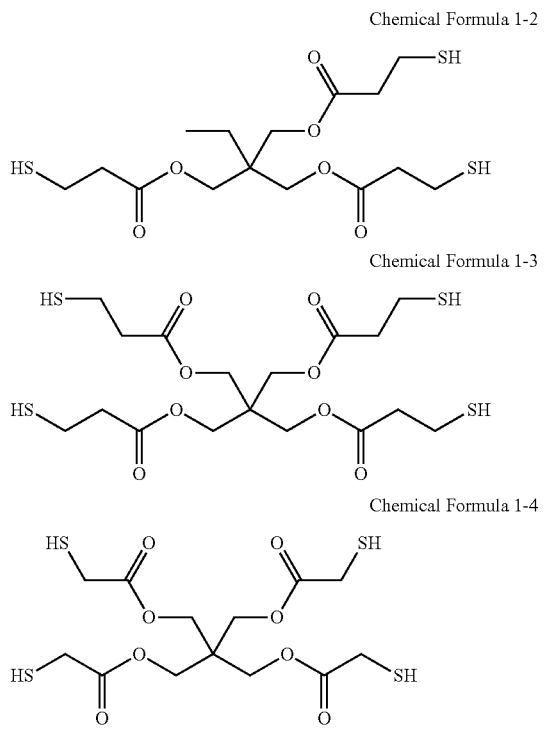

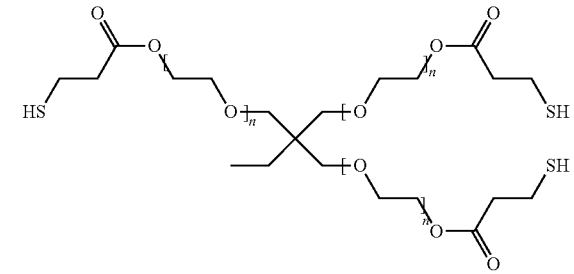

Herein, n is an integer of 1 to 20.

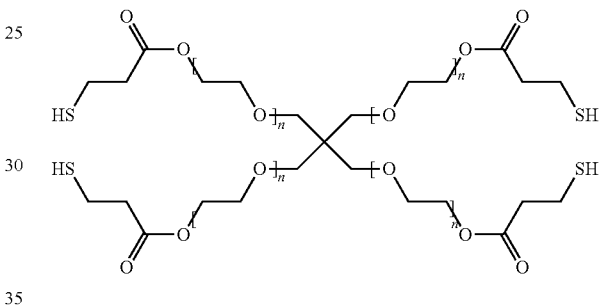

Herein, n is an integer of 1 to 20.

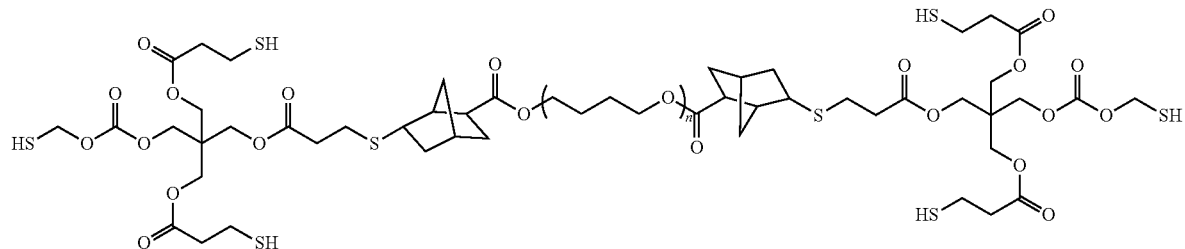

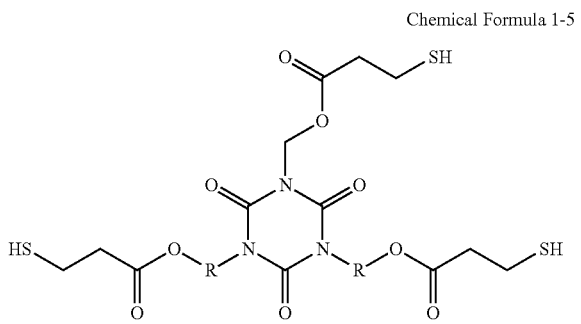

Herein, n is an integer of 1 to 20.

The compounds of Chemical Formula 1-2 to Chemical Formula 1-8 may be, for example, commercially available from a vendor, for example from Sartomer, or may be synthesized using a well-known method.

The second monomer may be represented by the following Chemical Formula 2.

$$[R^2\!-\!]_{k3}L_2\!-\![Y_2\!-\!(X)_n]_{k4}$$      Chemical Formula 2

In Chemical Formula 2, X, the definitions of $R^2$, $L_2$, $Y_2$, n, k3, and k4 are the same as set forth above.

In an embodiment, X of Chemical Formula 2 may be selected from an acrylate group; a methacrylate group; a C2 to C30 alkenyl group; a C2 to C30 alkynyl group; a substituted or unsubstituted C3 to C30 alicyclic organic group having a carbon-carbon double bond or a carbon-carbon triple bond in the ring; a substituted or unsubstituted C3 to C30 heterocycloalkyl group having a carbon-carbon double bond or a carbon-carbon triple bond in the ring; a C3 to C30 alicyclic organic group substituted with a C2 to C30 alkenyl group or a C2 to C30 alkynyl group; and a C3 to C30 heterocycloalkyl group substituted with a C2 to C30 alkenyl group or a C2 to C30 alkynyl group.

In Chemical Formula 2, $L^2$ may include one selected from a linear or branched C1 to C30 alkylene moiety, a tricyclodecane moiety, a pyrrolidine moiety, a tetrahydrofuran moiety, a pyridine moiety, a pyrimidine moiety, a piperidine moiety, a triazine moiety, and an isocyanurate moiety.

The substituted or unsubstituted C3 to C30 alicyclic organic group having a carbon-carbon double bond or a carbon-carbon triple bond in the ring may be at least one selected from a norbornene group, a maleimide group, a nadimide group, and a tetrahydrophthalimide group.

In an embodiment, the second monomer may be at least one selected from a C4 to C100 diallyl compound such as 1,3-butadiene, or diallyl succinate, a C7 to C100 triallyl compound such as triallyl borate, 2,4,6-triallyloxy-1,3,5-triazine, or 1,3,5-triallyl-1,3,5-triazine-2,4,6(1H,3H,5H)-trione, a C6 to C100 diallyl ether compound such as allyl ether, trimethylolpropane diallyl ether, or 2,2'-diallyl bisphenol A diacetate ether, a C10 to C100 triallyl ether compound such as 1-(allyloxy)-2,2-bis((allyloxy)methyl)butane, a C4 to C100 di(meth)acrylate compound such as ethylene glycol dimethacrylate, hexanediol diacrylate, tricyclodecane dimethanol diacrylate, a C9 to C100 tri(meth)acrylate compound such as trimethylol propane triacrylate, or ethoxylated trimethylolpropane triacrylate, and a divinyl ether compound such as triethylene glycol divinyl ether, bis[4-(vinyloxy)butyl]adipate, or 1,4-butanediol divinyl ether.

The second monomer of Chemical Formula 2 may be represented by one selected from Chemical Formula 2-1, Chemical Formula 2-2, Chemical Formula 2-3, and Chemical Formula 2-4.

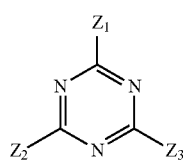

Chemical Formula 2-1

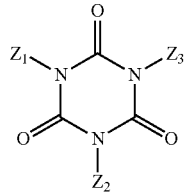

Chemical Formula 2-2

In Chemical Formulae 2-1 and 2-2, each of $Z_1$ to $Z_3$ corresponds independently *—$Y_2$—$X_n$ as defined for Chemical Formula 2.

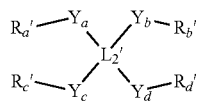

Chemical Formula 2-3

In Chemical Formula 2-3, $L_2'$ is selected from carbon; a substituted or unsubstituted C1 to C30 tetravalent alkane-derived group; a substituted or unsubstituted C2 to C30 tetravalent alkene-derived group; a C1 to C30 tetravalent alkyne-derived group, wherein at least one methylene (—$CH_2$—) group is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), a C6 to C10 cycloalkylene group, or a combination thereof; a C2 to C30 tetravalent alkene-derived group, wherein at least one methylene (—$CH_2$—) group is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), a C6 to C10 cycloalkylene group, or a combination thereof; a substituted or unsubstituted C6 to C30 tetravalent arene-derived group; a substituted or unsubstituted C3 to C30 tetravalent heteroarene-derived group; a substituted or unsubstituted C3 to C30 tetravalent cycloalkane-derived group; and a substituted or unsubstituted C3 to C30 tetravalent heterocycloalkane-derived group, each of $Y_a$ to $Y_d$ are independently selected from a single bond; a substituted or unsubstituted C1 to C30 alkylene group; a substituted or unsubstituted C2 to C30 alkenylene group; or a C1 to C30 alkylene group or a C2 to C30 alkenylene group, wherein at least one methylene (—$CH_2$—) group is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and $R'_a$ to $R'_d$ are $R^2$ or X of Chemical Formula 2, provided that at least two of $R'_a$ to $R'_d$ are X of Chemical Formula 2.

In an embodiment, the second monomer may include at least one selected from a compound of the following Chemical Formula 2-4, a compound of the following Chemical Formula 2-5, a compound of the following Chemical Formula 2-6, a compound of the following Chemical Formula 2-7, a compound of the following Chemical Formula 2-8, a compound of the following Chemical Formula 2-9, a compound of the following Chemical Formula 2-10, a compound of the following Chemical Formula 2-11, a compound of the following Chemical Formula 2-12, a compound of the following Chemical Formula 2-13, a compound of the following Chemical Formula 2-14, and a compound of the following Chemical Formula 2-15.

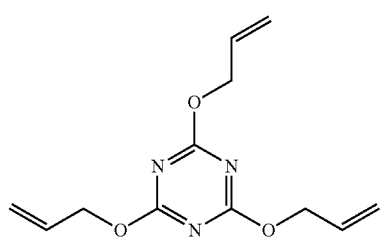

Chemical Formula 2-4

Chemical Formula 2-5

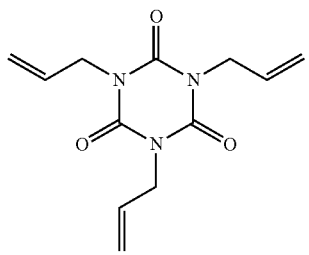

Chemical Formula 2-6

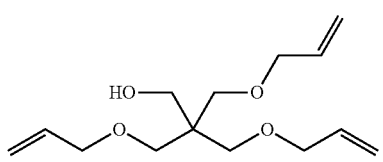

Chemical Formula 2-7

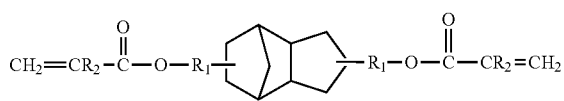

In Chemical Formula 2-7, $R_1$ is selected from a C1 to C20 alkylene group and a C1 to C20 alkylene group, wherein at least one methylene (—$CH_2$—) group is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and $R_2$ is selected from hydrogen and a methyl group.

Chemical Formula 2-8

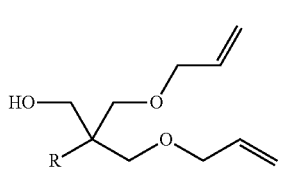

In Chemical Formula 2-8, R is a C1 to C10 alkyl group.

Chemical Formula 2-9

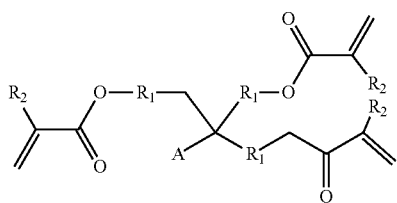

In Chemical Formula 2-9, A is selected from a C1 to C10 alkyl group and a hydroxy group; $R_1$ is selected from a single bond, a C1 to C20 alkylene group and a C1 to C20 alkylene, wherein at least one methylene (—$CH_2$—) group is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and $R_2$ is selected from hydrogen and methyl group.

Chemical Formula 2-10

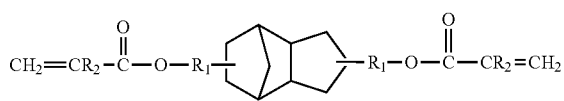

In Chemical Formula 2-10, $R_1$ is selected from a C1 to C20 alkylene and a C1 to C20 alkylene, wherein at least one methylene (—$CH_2$—) group is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and $R_2$ is selected from hydrogen and methyl group.

Chemical Formula 2-11

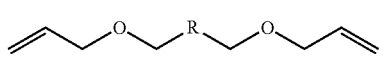

In Chemical Formula 2-11, R is selected from a single bond, a C1 to C20 alkylene, and a C1 to C20 alkylene, wherein at least one methylene (—$CH_2$—) group is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof.

Chemical Formula 2-12

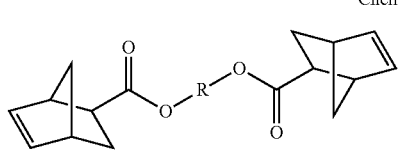

In Chemical Formula 2-12, R is selected from a C1 to C20 alkylene and a C1 to C20 alkylene, wherein at least one methylene (—$CH_2$—) group is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof.

Chemical Formula 2-13

Chemical Formula 2-14

Chemical Formula 2-15

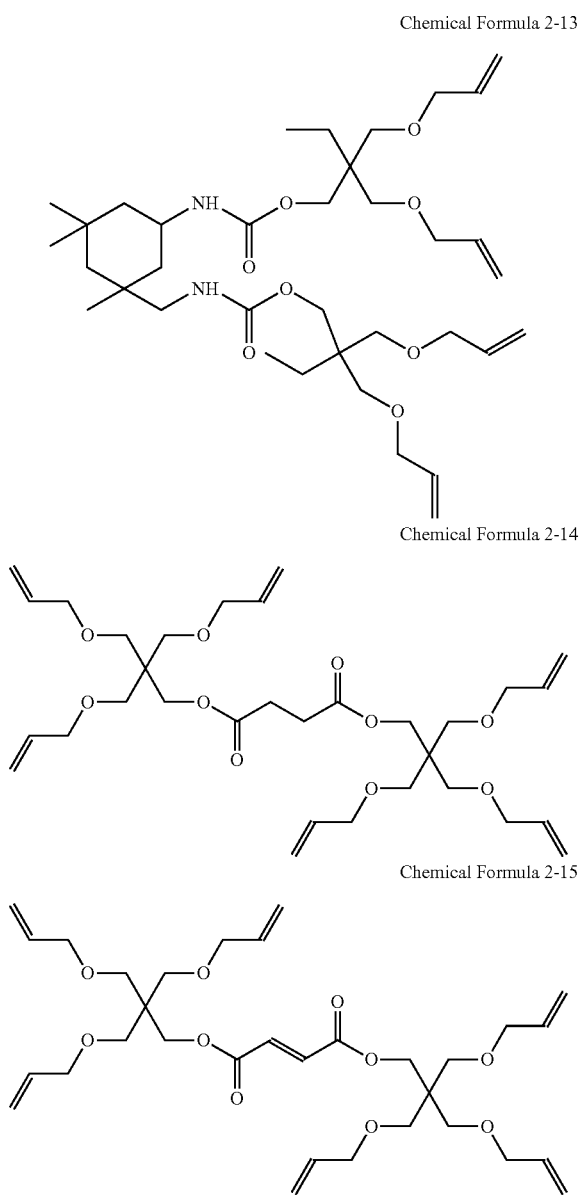

In the monomer mixture, the amounts of the first monomer and the second monomer are not particularly limited, and may be adjusted in order to obtain desired properties. For example, in the monomer mixture, the amounts of the first monomer and the second monomer may be adjusted so that a mole ratio between the thiol group of the first monomer and the carbon-carbon unsaturated bond of the second monomer may be about 1:0.1 to about 1:10, for example, about 1:0.2 to about 1:5, about 1:0.75 to about 1:3, about 1:about 1.1 to 2, or about 1:about 1.5 to 1.8. When the monomer mixture includes the first monomer and the second monomer within the aforementioned ranges, the prepared polymer composite may form a high density network, and thus have enhanced mechanical strength and other properties.

The composition for the light emitting particle-polymer composite may further include at least one of a third monomer having one thiol (—SH) group at its terminal end and a fourth monomer having one carbon-carbon unsaturated bond-containing group at its end, or a combination thereof. The third monomer is a compound where in Chemical Formula 1, m and k2 are 1, and the fourth monomer is a compound where in Chemical Formula 2, n and k4 are 1.

Examples of the third monomer may be a C1 to C20 alkyl 3-mercaptopropionate, alkylthio glycolate, a C1 to C20 thiol substituted (meth)acrylate, a C1 to C20 thiol substituted silane, for example (3-mercaptopropyl)trimethoxysilane, but are not limited thereto.

Examples of the fourth monomer may include (meth)acrylates such as isobornyl (meth)acrylate, isooctyl (meth)acrylate, lauryl (meth)acrylate, benzoyl (meth)acrylate, norbornyl acrylate, (meth)acrylate, cyclohexyl (meth)acrylate, n-hexyl (meth)acrylate, iso-octyl (meth)acrylate, butyl (meth)acrylate, adamantyl acrylate, or cyclopentyl acrylate; alkenes such as vinyl ether, alkyl ether, propenyl ether, pentene, or hexyne; unsaturated ester, maleimide, acrylonitrile, styrene, diene, or N vinyl amide, but are not limited thereto.

The amounts of the third monomer and the fourth monomer are not particularly limited, and may be selected on the basis of miscibility, viscosity, release properties, and optical properties. For example, the amount of the third monomer such as (3-mercaptopropyl)trimethoxysilane may be about 30 parts by weight or less, for example about 20 parts by weight or less, about 15 parts by weight or less, or about 10 parts by weight or less based on 100 parts by weight of the monomer mixture, and the amount of the fourth monomer such as lauryl methacrylate may be about 30 parts by weight or less, for example, about 20 parts by weight or less, about 15 parts by weight or less, about 12 parts by weight or less, or about 10 parts by weight or less based on 100 parts by weight of the monomer mixture, but are not limited thereto. Within the above ranges, the prepared composite may have improved mechanical properties, and a process of manufacturing a composite may be performed smoothly.

The di(meth)acrylate compound, the tri(meth)acrylate compound, or the monoacrylate compound may be a polymerizable oligomer selected from urethane (meth)acrylate, epoxy (meth)acrylate, polyester (meth)acrylate, acrylic (meth)acrylate, polybutadiene (meth)acrylate, silicone (meth)acrylate, melamine (meth)acrylate, and a combination thereof. A molecular weight of the polymerizable oligomer is not particularly limited, and may be selected appropriately. For example, a molecular weight of the polymerizable oligomer may be about 1,000 to about 20,000 grams per mole (g/mol), but is not limited thereof. Such a polymerizable oligomer may be synthesized by a well-known method or may be commercially available.

The monomer mixture (i.e., thiol-ene system) may provide a cross-linked polymer by UV irradiation, for example, according to a reaction scheme shown in FIG. 1. The properties (e.g., cross-linking degree) of the polymer prepared from the composition may be controlled by adjusting the number of the thiol groups of the first monomer and the number of the unsaturated bonds of the second monomer.

The monomer mixture may further include an initiator for promoting a cross-linking reaction between the thiol group and the carbon-carbon unsaturated bond. Examples of the initiator may include a phosphine oxide compound, α-amino ketone, phenyl glyoxylate, monoacyl phosphine, benzyldimethyl-ketal, hydroxyketone, azobisisobutyronitrile (AIBN), benzoyl peroxide, and the like.

The polymer prepared from the monomer composition has improved compatibility with the light emitting particles and may be cured at room temperature within a short period of time. Accordingly, the obtained light emitting particles may have improved light emitting characteristics, and a high temperature process having an unfavorable influence on the light emitting particles (e.g., deterioration of stability) may not be needed. In addition, the prepared polymer composite forms a densely cross-linked structure and thus prevents oxygen or moisture from penetrating the composite. Accordingly, the above monomer mixture and the cross-linked polymer prepared therefrom may stably maintain optical characteristics of the light emitting particles and be applied in various fields. For example, the above monomer mixture and the cross-linking polymer formed therefrom may be usefully applied to an organic light emitting diode (OLED) such as a light emitting diode (LED) device or a light emitting device, a memory device, a laser device, and a photoelectric device such as a solar cell.

In particular, research on a QD film using a quantum dot as a light emitting particle in a display device such as an LCD has been actively conducted to improve color reproducibility and display quality. Processes for preparing the QD film are known in the art. In a process embodiment, the QD film is manufactured by adding a quantum dot (or a quantum dot dispersion) to a desired host matrix (i.e., a monomer mixture) and coating the mixture on a substrate (e.g., by spin-coating, blade-coating, and the like). On the QD film thus prepared, a filling resin layer may be further formed by coating the resin or a different monomer or polymer composition.

Figure 3:
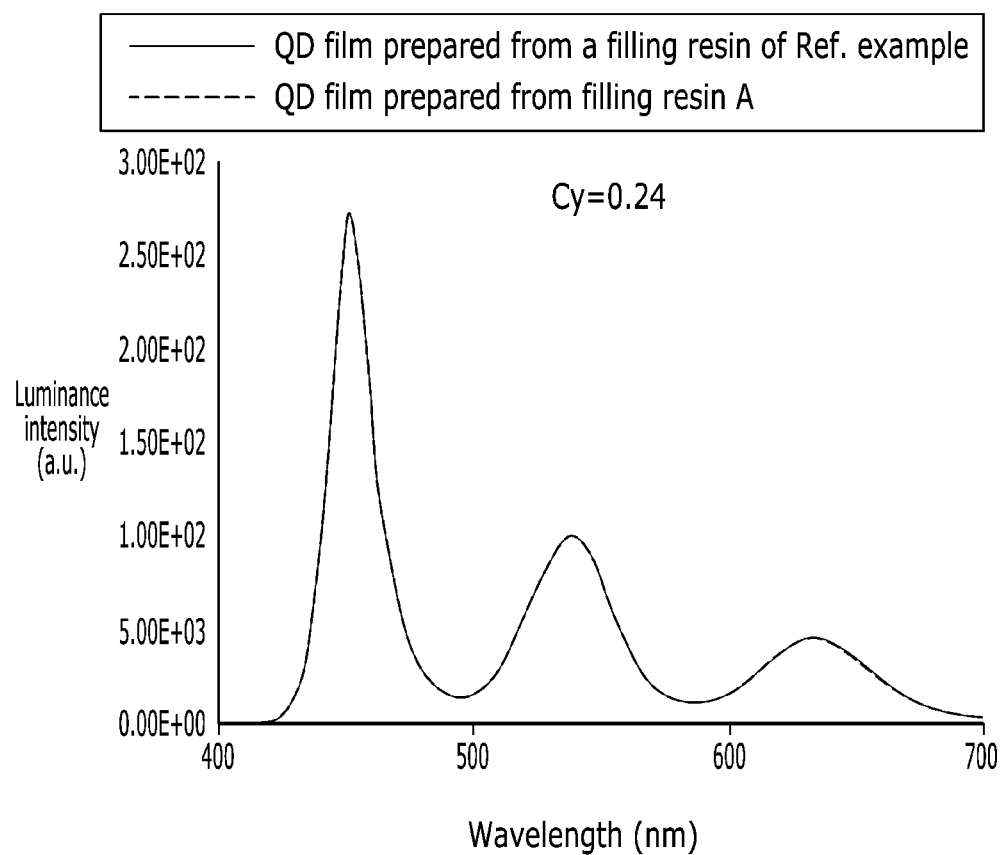
FIG. 3 is a graph of luminescence intensity (arbitrary units, a. u.) versus wavelength (nanometer, nm), showing the result of Example 4.

When applied to the QD film, the monomer mixture (i.e., a thiol-ene system) has many advantages as described above. However, its poor storage-stability often poses a significant obstacle in a manufacturing process. In other words, the monomer mixture may undergo spontaneous initiation during its storage, and thus may change its initially fluid state to a gel or solid state. This may pose a serious problem of hampering the formation of a uniform coating. Without wishing to be bound to any theory, it is believed that the thiol-ene system may easily undergo self-polymerization even with a trace amount of a reactive radical present (e.g., a radical produced by active oxygen in the air) and thus may show very poor storage stability. For example, as shown in FIG. 3, a hydroxy radical produced by active oxygen may remove hydrogen from the double bond carbon or the thiol, producing a propagational radical and thereby resulting in the initiation of polymerization. In particular, when a thiol-ene resin is used as a quantum dot-polymer composite, reactants used during the QD synthesis, for example, trioctylphosphine, sulfur (S)-coordinated trioctylphosphine, and the like, are not removed but remain on the quantum dot, and may further promote the curing of a thiol-ene system during manufacture of the quantum dot-polymer composite.

Surprisingly, the present inventors have found that undesired curing phenomena may be substantially suppressed or prevented by adding at least one additive selected from a zinc compound, an indium compound, ascorbic acid or a salt thereof, citric acid, a citrate salt, a tocopherol, a tocotrienol, and a combination thereof to the monomer mixture. As used herein, the term "undesired or natural curing" refers to the embodiment wherein a monomer composition (i.e., the thiol-ene system) shows a viscosity increase of greater than or equal to 50% without any irradiation by UV rays. The aforementioned additive may deactivate unremoved reactant that may induce a curing of the thiol-ene system, thus preventing the curing thereof. In addition, the aforementioned additive may stop propagation of a naturally occurring, highly reactive radical, thereby enhancing storage stability of the thiol-ene system. In addition, the aforementioned additive does not adversely affect the formation of the polymer composite by the UV curing of the monomer mixture (i.e., the thiol-ene system). Furthermore, the above additive does not have any substantial effect on physical or optical properties of a manufactured film. For example, when the monomer mixture includes light emitting particles such as quantum dots, the additive substantially does not really have any substantial effect on the luminous efficiency and a wavelength of emitted light emitting particles and their stability in a composition or a polymer composite.

Among the additive, the zinc compound may include at least one selected from a zinc inorganic acid salt or a zinc organic acid salt including a counter ion with pKa of at least 3, a zinc halide, a zinc oxide, a zinc metal, and a dialkyl zinc. The indium compound may include at least one selected from an indium inorganic acid salt or an indium organic acid salt including a counter ion with pKa of at least 3, an indium halide, an indium oxide, an indium metal, a dialkyl indium, or a combination thereof. As used herein, the term "organic acid" refers to a compound represented by a chemical formula of RCOOH (wherein R is a C1 to C20 alkyl). For example, the zinc inorganic acid salt or zinc organic acid salt including a counter ion with pKa of at least 3 may be zinc acetate, zinc stearate, zinc oleate, or zinc palmitate. The zinc halide may include $ZnF_2$ but does not include $ZnCl_2$. The zinc oxide may include ZnO. The dialkyl zinc may include dimethyl zinc or diethyl zinc. The indium inorganic acid salt or indium organic acid salt including a counter ion with pKa of at least 3 may be indium acetate, indium stearate, indium oleate, or indium palmitate. The indium halide may include $InF_3$. The zinc oxide may include $In_2O_3$. The dialkyl indium may include dimethyl indium or diethyl indium.

The additive may be included in an amount of about 0.001 part by weight to about 10 parts by weight, for example, about 0.005 parts by weight to about 1 part by weight, or about 0.01 part by weight to about 0.1 part by weight based on 100 parts by weight of the monomer mixture. The amounts within the above range are desirable in terms of solubility of the additive in the resin composition.

The composition may further include at least one light emitting particle selected from a Group II-VI compound semiconductor nanocrystal, a Group III-V compound semiconductor nanocrystal, a Group IV-VI compound semiconductor nanocrystal, and a Group IV compound semiconductor nanocrystal. The composition may further include at least one light emitting particle selected from a metal nanocrystal, a metal oxide nanocrystal, a phosphor, and a pigment.

The Group II-IV compound may be selected from a binary element compound selected from CdSe, CdTe, ZnS, ZnSe, ZnTe, ZnO, HgS, HgSe, HgTe, MgSe, MgS, and a mixture thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from a binary element compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from a binary element compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof.

The Group IV compound may be selected from a single-element compound selected from Si, Ge, and a mixture thereof; and a binary element compound selected from SiC, SiGe, and a mixture thereof.

The binary element compound, the ternary element compound or the quaternary element compound respectively exist in a uniform concentration within the semiconductor nanocrystal particle or partially different concentrations within the same particle. In addition, the semiconductor nanocrystal may have a core-shell structure wherein a semiconductor nanocrystal surrounds another (different) semiconductor nanocrystal. The core and shell may have an interface, and an element of at least one of the core or the shell in the interface may have a concentration gradient wherein the concentration of the element(s) of the shell decreases toward the core. In addition, the semiconductor nanocrystal may have one core of a semiconductor nanocrystal and multi-shells surrounding the core. The core and multi-shell structure has at least two shells wherein each shell may be a single composition, an alloy, or the one having a concentration gradient.

In the semiconductor nanocrystal particle, the materials of the shell may have a larger energy bandgap than that of the core. As a result, the semiconductor nanocrystal may exhibit a quantum confinement effect more effectively. In case of a multi-shell type of semiconductor nanocrystal particle, the bandgap of the material of an outer shell may be of higher energy than that of the material of an inner shell (a shell that is closer to the core). In this embodiment, the semiconductor nanocrystal may emit light of a wavelength ranging from UV to infrared light.

The semiconductor nanocrystal may have quantum efficiency of greater than or equal to about 10%, greater than or equal to about 30%, for example, greater than or equal to about 50%, greater than or equal to about 60%, greater than or equal to about 70%, or greater than or equal to about 90%.

The semiconductor nanocrystal may be designed to have a wider or narrower full width at half maximum (FWHM) in its photoluminescence spectrum depending on its application. By way of an example, for use in display devices, the semiconductor nanocrystal may have a narrower FWHM so as to realize enhanced color purity or color reproducibility. The semiconductor nanocrystal may have a FWHM of less than or equal to about 45 nanometers (nm), for example less than or equal to about 40 nm, or less than or equal to about 30 nm. Within such ranges, a device including the nanocrystal may have enhanced color purity or improved color reproducibility.

The semiconductor nanocrystal may have a particle diameter (the longest diameter in case of a non-spherical particle) ranging from about 1 nm to about 100 nm, for example about 1 nm to about 20 nm, or for example about 1 nm to 10 nm.

The shape of the semiconductor nanocrystal is not particularly limited. By way of an example, the nanocrystal may have a spherical shape, a pyramidal shape, a multi-arm shape, a cubic shape, an elliptical shape, a tetrahedral shape, an octahedral shape, a cylindrical shape, a polygonal pillar-like shape, a conical shape, a columnar shape, a tubular shape, a helical shape, a funnel shape, a dendritic shape, or any of various common regular and irregular shapes. The nanocrystal may be in the form of a nanoparticle, a nano-tube, a nanowire, a nano-fiber, a nano-plate particle, a nanosheet, or the like.

The semiconductor nanocrystal may be prepared in any method. For example, the semiconductor nanocrystal may be prepared by the method described hereinbelow, but it is not limited thereto.

In a non-limiting example, the semiconductor nanocrystal having a several nanometer size may be prepared via a wet chemical method. In the wet chemical method, precursors react in an organic solvent to grow nanocrystal particles, and the organic solvent or a ligand compound may coordinate the surface of the semiconductor nanocrystal, controlling the growth of the nanocrystal. As the organic materials on the surface of the semiconductor nanocrystal may adversely affect the stability of the device, extra organic materials—not coordinating the surface of the nanocrystal may be removed by adding the nanocrystal to an excess amount of a non-solvent and centrifuging the resulting mixture. Examples of the non-solvent may include, but are not limited to, acetone, ethanol, and methanol. After the removal of extra organic materials, the amount of the organic materials coordinated on the surface of the nanocrystal may be less than or equal to about 35% by weight, based on the total weight of the nanocrystal. The organic materials may include a ligand compound, an organic solvent, or a combination thereof. The ligand compound may be any organic compound that may be used as a ligand compound in the wet chemical method, and the types thereof are not particularly limited. For example, the ligand compound may be $RCOOH$, $RNH_2$, $R_2NH$, $R_3N$, $RSH$, $R_3PO$, $R_3P$, $ROH$, $RCOOR'$, $RCONH_2$, $RCONHR'$, $RCONR'R''$, $RCN$, $RPO(OH)_2$, or $R_2POOH$, wherein R and R' are each independently a C1 to C24 alkyl group, a C2 to C24 alkenyl group, or a C6 to C24 aryl group. The organic ligand compound may be coordinated to the surface of the nanocrystals as prepared, to assist efficient dispersing of the nanocrystals in a solution, and improving the light-emitting and electrical characteristics of the nanocrystals. Examples of the organic ligand compound may include, but are not limited to: a thiol such as methanethiol, ethanethiol, propanethiol, butanethiol, pentanethiol, hexanethiol, octanethiol, dodecanethiol, hexadecanethiol, octadecanethiol, and benzylthiol; an amine such as methaneamine, ethaneamine, propaneamine, butaneamine, pentaneamine, hexaneamine, octaneamine, dodecaneamine, hexadecylamine, octadecylamine, dimethylamine, diethylamine, trioctyl amine, and dipropylamine; an alcohol such as methanol, ethanol, propanol, and butanol; an acid such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, and benzoic acid; an ester thereof such as methyl acetate, ethyl acetate, methyl propionate, ethyl propionate; an amide thereof such as methyl acetamide, ethyl acetamide, methyl, propionamide, or ethyl propionamide; a nitrile thereof such as acetonitrile, propionitrile, butyronitrile; a phosphine such as methylphosphine, ethylphosphine, propylphosphine, butylphosphine, pentylphosphine, and the like, or an oxide compound thereof such as methylphosphine oxide, ethylphosphine oxide, propylphosphine oxide, butylphosphine oxide, and the like; a diphenylphosphine compound, a triphenylphosphine compound, and an oxide compound thereof; and a phosphonic acid. The organic ligand compound may be used alone or as a mixture of two or more compounds. The solvent may be any one used in the wet chemical method, and the types thereof are not particularly limited. For example, the solvent may be selected from the group consisting of: a C6 to C22 primary amine such as hexadecylamine, a C6 to C22 secondary amine such as dioctylamine, and a C6 to C40 tertiary amine such as trioctylamine; a heterocyclic compound having a nitrogen atom such as pyridine; a C6 to C40 aliphatic hydrocarbon (e.g., alkane, alkene, alkyne, and the like) such as hexadecane, octadecane, octadecene, and squalane; a C6 to C40 aromatic hydrocarbon such as phenyl dodecane, phenyl tetradecane, phenyl hexadecane, and the like; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, benzyl ether, and the like; and a combination thereof, but it is not limited thereto.

In another embodiment, the polymer composite may include a thiol-ene cross-linking polymerization product of a first monomer having at least two thiol (—SH) groups at its terminal end and a second monomer having at least two carbon-carbon unsaturated bond-containing groups at its end; and at least one an additive selected from a zinc compound, an indium compound, ascorbic acid or a salt thereof, citric acid or a salt thereof, a tocopherol, and a tocotrienol.

The polymer composite may further include at least one light emitting particle selected from a Group II-VI compound semiconductor nanocrystal, a Group III-V compound semiconductor nanocrystal, a Group IV-VI compound semiconductor nanocrystal, and a Group IV compound semiconductor nanocrystal.

The polymer composite may further include at least one light emitting particle selected from a metal nanocrystal, a metal oxide nanocrystal, a phosphor, and a pigment.

The polymer composite may be prepared by polymerizing the composition (e.g., via heat treatment or UV irradiation), for example, according to a reaction scheme in FIG. 1. The reaction scheme of thiol-ene polymerization is known in the art (see J. Polymer Sci.: Part A: Polymer Chem. Vol. 42, 5301 2004). The first monomer, the second monomer, the additive, and the light emitting particle are the same as set forth above.

In a non-limiting embodiment, the polymer composite may be prepared by mixing the monomer mixture and the additive, (and then, if necessary, removing a solvent therefrom) to obtain a composition, and curing (e.g., UV-curing) the same. During the UV curing, UV rays may have a wavelength of about 365 nm or less and at a dose of about 50 milliJoules per square centimeter ($mJ/cm^2$) or more, without limitation.

When the polymer composite includes light emitting particles, for example, semiconductor nanocrystals (hereinafter, quantum dots or QD), the polymer composite may be prepared by removing an excessive organic material from QDs as synthesized in a colloid state. This can be accomplished by either dispersing the resultant in an organic solvent or preparing the resultant as a powder, mixing the resultant with the monomer mixture and the additive to obtain a composition (if necessary, by removing the solvent), and curing the composition (e.g., by UV-curing). Examples of the organic solvent for dispersion may include, but are not limited to, chloroform, hexene, an acrylate-based monomer, or a combination thereof. Alternatively, after substituting the surface of the QDs as synthesized in a colloidal state with a polymer having a similar chemical structure to that of a ligand compound used during the synthesis thereof, a stable QD-polymer composite may be formed using the above method.

In non-limiting examples, various protective films (e.g., a barrier layer) such as a silica, titania, or alumina film for blocking oxygen or moisture may be disposed (e.g., coated or laminated) on the semiconductor nanocrystal-polymer composite so as to enhance the stability of the composite.

Another embodiment provides a film including the polymer composite. The film may further include a barrier film contacting the surface of the composite. Non-limiting examples of a method of manufacturing such a film are the same as in the method of manufacturing the QD film which is described above in detail.

In another embodiment, an electronic device includes the film.

The electronic device may be a display, a light emitting device such as a backlight unit for a liquid crystal display device, a memory device, a laser device, or a solar cell.

The light emitting device may include a light source, and the film is positioned in such a way that the film may transmit light emitted from the light source.

The device may be manufactured according to known methods, and a specific structure thereof is also known in the art. As a non-limiting example, a backlight unit for a liquid crystal display device is described in detail as follows.

The backlight unit includes an LED light source;

a light conversion layer disposed separately from the LED light source to convert light emitted from the LED light source to white light and to provide the white light to the liquid crystal panel; and a light guide panel disposed between the LED light source and the light conversion layer, wherein the light conversion layer includes the semiconductor nanocrystal-polymer composite. The semiconductor nanocrystal-polymer composite is the same as set forth above. Hereinafter, a backlight unit according to an embodiment and a liquid crystal display device including the same are explained referring to the drawings.

Figure 5:
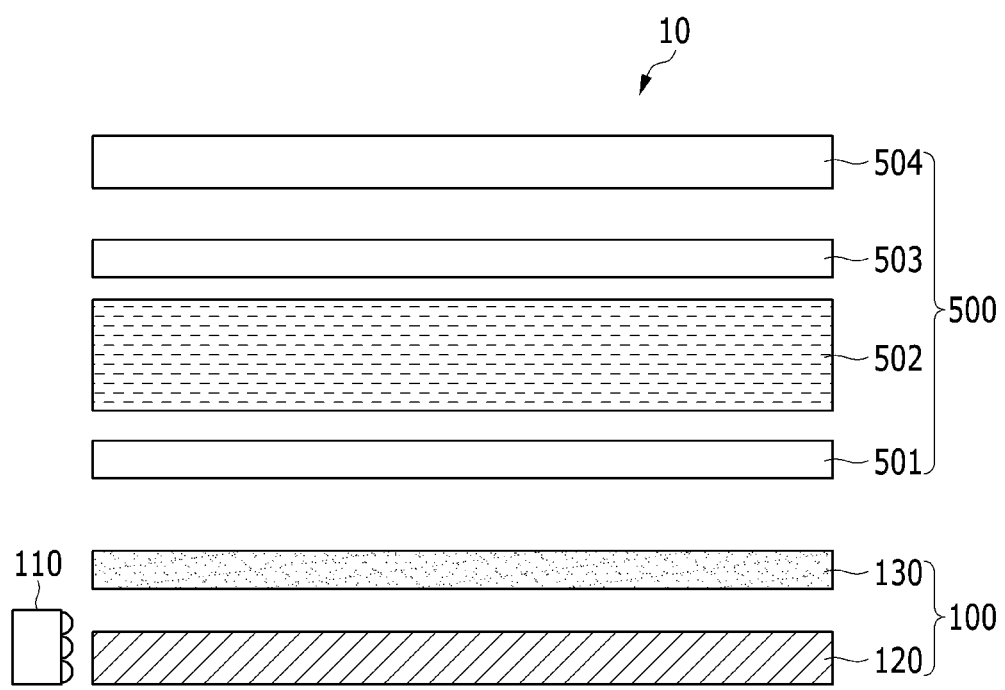
FIG. 5 schematically shows a liquid crystal display device including a backlight unit according to an embodiment.

FIG. 5 is a schematic view of a liquid crystal display device 10 including a backlight unit in accordance with an embodiment.

Referring to FIG. 5, the liquid crystal display device 10 includes a backlight unit 100 and a liquid crystal panel 500 to provide a predetermined colored image using white light provided from the backlight unit 100.

The backlight unit 100 includes a light emitting diode ("LED") light source 110, a light conversion layer 130 to convert light emitted from the LED light source 110 to white light, and a light guide panel 120 disposed therebetween to guide the light emitted from the LED light source 110 to the light conversion layer 130. The LED light source 110 includes a plurality of LED chips emitting light having predetermined wavelengths. The LED light source 110 may be a blue light-emitting LED light source or an ultraviolet (UV)-emitting LED light source, for example.

A reflector (not shown) may be further disposed on the lower surface of the light guide panel 120.

The light conversion layer 130 is spaced apart from the LED light source 110 by a predetermined distance and converts light emitted from the LED light source 110 to white light, which is then transmitted to the liquid crystal panel 500.

The light conversion layer 130 includes the polymer composite including a light emitting particle, for example a quantum dot. Details of the polymer composite are the same as set forth above.

The backlight unit 100 may further include a diffusion plate on the light guide panel 120, and the light conversion layer 130 may be disposed between the light guide panel and the diffusion plate, or on a side of the diffusion plate opposite the light guide panel. Materials and structures for each of the LED light source 110, the light guide panel 120, the diffusion plate, and the liquid crystal panel 500 are known in the art and are commercially available, and thus are not particularly limited.

Figure 2:
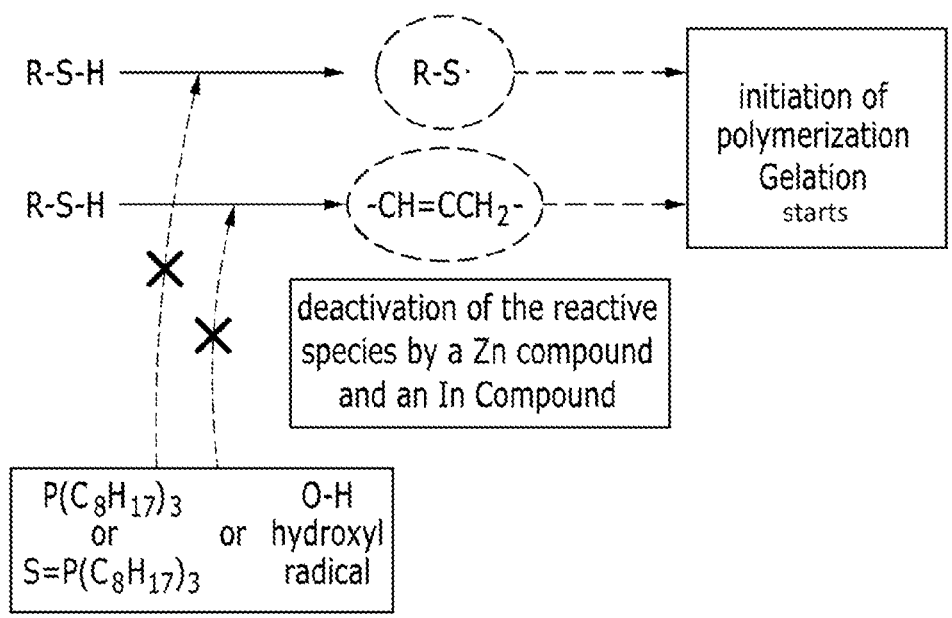
FIG. 2 is a diagram showing an initiation reaction scheme that may occur during (undesired) curing in the thiol-ene system.

The polymer composite may be manufactured in the form of a film. The film may be manufactured by using a mold or by casting to have various thicknesses and forms. Alternatively, the polymer composite may be prepared according to the process of FIG. 2. In this case, the resin composition and/or quantum dot (QD)-containing resin composition may include at least one additive selected from a zinc compound, an indium compound, ascorbic acid or a salt thereof, citric acid or a salt thereof, a tocopherol, and a tocotrienol.

When the light emitted from the LED light source 110 is passed through the light conversion layer 130, blue light, green light, and red light are mixed to emit white light. By changing the compositions and sizes of semiconductor nanocrystals in the light conversion layer 130, the blue light, green light, and red light may be controlled in a ratio as desired, so as to provide white light which provides excellent color reproducibility and color purity. The white light may have color coordinates where Cx is about 0.2 to about 0.56 and Cy is about 0.2 to about 0.42 in a CIE 1931 chromaticity diagram. As evidenced from the results, the additive does not cause any changes of color coordinates of the light conversion layer including the polymer composite.

In an embodiment, the light conversion layer 130 may include a plurality of layers. In an embodiment, the plurality of layers may be disposed so that the light emitting wavelength becomes longer in a direction towards the LED light source 110. For example, if the LED light source 110 is a blue LED light source, the light conversion layer 130 may include a red light conversion layer and a green light conversion layer that are sequentially stacked in a direction away from the LED light source 110.

Even though not shown in FIG. 5, on the light conversion layer 130, a film, e.g., a diffusion plate, a prism sheet, a microlens sheet, a brightness enhancement film (e.g., a double brightness enhancement film ("DBEF")), or a combination thereof, may be further disposed. In addition, the light conversion layer 130 may be disposed between at least two films, e.g., a light guide panel, a diffusion plate, a prism sheet, a microlens sheet, a brightness enhancement film (e.g., a double brightness enhancement film ("DBEF")), or a combination thereof.

Figure 6:
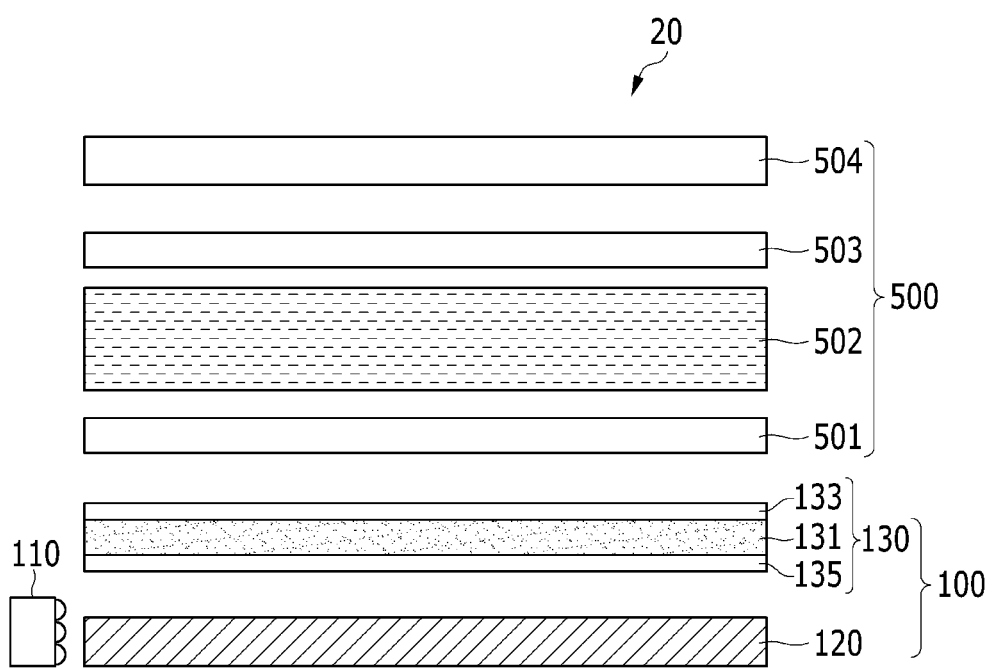
FIG. 6 schematically shows a liquid crystal display device including a backlight unit according to another embodiment.

FIG. 6 is a schematic view of a liquid crystal display device 20 including the backlight unit 100 according to another embodiment.

As shown in FIG. 6, a light conversion layer 130 may include a film 131 including the polymer matrix and the semiconductor nanocrystal, and at least one of a first polymer film 133 and a second polymer film 135 may be disposed on at least one surface of the film 131. The second polymer film 135 disposed under the film 131 may act as a barrier for preventing degradation of the semiconductor nanocrystal caused by the LED light source 120.

The first polymer film 133 and the second polymer film 135 may include a polyester, a cyclic olefin polymer ("COP"), a second polymer product produced by polymerization of the first monomer including at least two thiol (—SH) groups, each located at a terminal end of the first monomer, and the second monomer including at least two unsaturated carbon-carbon bonds at a terminal end of the second monomer, or a combination thereof. The polyester may include polyethylene terephthalate, polybutylene terephthalate, polyethylene naphthalate, or the like, or a combination thereof. The cyclic olefin polymer may be a polymer produced by chain copolymerization of a cyclic monomer, such as a norbornene or a tetracyclododecene, with a linear olefin monomer such as ethylene. In an embodiment, the polymerized product of the first monomer including at least two thiol (—SH) groups, each located at a terminal end of the first monomer, and the second monomer including at least two unsaturated carbon-carbon bonds at a terminal end of the second monomer may be the same as set forth above.

At least one of the first polymer film 133 and the second polymer film 135 may further include an inorganic oxide. The inorganic oxide may include silica, alumina, titania, zirconia, or a combination thereof. The inorganic oxide may act as a light diffusion material. The inorganic oxide may be coated with a thickness of about 10 nm to about 100 nm on a surface of at least one of the first polymer film 133 and the second polymer film 135.

The first polymer film 133 may have a concavo-convex pattern having a predetermined size on the surface opposite, e.g., not contacting, the film 131 including a polymer matrix and semiconductor nanocrystal. The second polymer film 135 may also have a concavo-convex pattern having a predetermined size on the surface opposite, e.g., not contacting, the film 131 including a polymer matrix and semiconductor nanocrystal. The first polymer film 133 and the second polymer film 135, with the concavo-convex pattern thereon, may suitably diffuse light emitted from the LED light source 110. Accordingly, the liquid crystal display device may omit a diffusion plate or a prism sheet that may be present on the light guide panel 120 in other embodiments. However, according to another embodiment, the diffusion plate or a prism sheet may be disposed on the light guide panel 120.

Even though not shown in FIG. 6, a film, e.g., a diffusion plate, a prism sheet, a microlens sheet, and a brightness enhancement film (e.g., a double brightness enhancement film ("DBEF")), or a combination thereof, may be further disposed on the light conversion layer 130. In addition, the light conversion layer 130 may be disposed between at least two films, e.g., a light guide panel, a diffusion plate, a prism sheet, a microlens sheet, a brightness enhancement film (e.g., a double brightness enhancement film ("DBEF")), or a combination thereof.

The white light emitted from the backlight unit, e.g., the backlight unit 100, is incident toward the liquid crystal panel 500. The liquid crystal panel 500 provides a predetermined color image using the white light incident from the backlight unit 100. The liquid crystal panel 500 may have a structure in which a first polarizer 501, a liquid crystal layer 502, a second polarizer 503, and a color filter 504 are sequentially disposed. The white light emitted from the backlight unit, e.g., the backlight unit 100, is transmitted through the first polarizer 501, the liquid crystal layer 502, and the second polarizer 503 and then into the color filter 504 to express a predetermined color image.

The liquid crystal panel is not particularly limited, and any liquid crystal panel that is known in the art or is commercially available may be included. Details for the liquid crystal display device are the same as set forth above.

Hereinafter, the embodiments are illustrated in more detail with reference to examples. However, they are exemplary embodiments of the present disclosure, and the present disclosure is not limited thereto.

EXAMPLES

Reference Example

Production of Bare Semiconductor Nanocrystals (1) 0.2 millimoles (mmol) of indium acetate, 0.6 mmol of palmitic acid, and 10 milliliters (mL) of 1-octadecene are placed in a flask. The flask is evacuated at 120° C. for one hour, filled with nitrogen gas ($N_2$), and heated to 280° C. A mixed solution of 0.1 mmol of tris(trimethylsilyl)phosphine ($TMS_3P$) and 0.5 mL of trioctylphosphine (TOP) is quickly injected thereto, and a reaction is allowed to proceed for 20 minutes. The reaction mixture is then rapidly cooled and acetone is added thereto to produce nanocrystals, which are then separated by centrifugation and dispersed in toluene. The first absorption maximum in UV-VIS spectrum of the InP core nanocrystals thus prepared is in the range of 420-600 nm.

0.3 mmol (0.056 gram (g)) of zinc acetate, 0.6 mmol (0.189 g) of oleic acid, and 10 mL of trioctylamine are placed in a flask. The flask is evacuated at 120° C. for 10 minutes, filled with nitrogen gas ($N_2$), and heated to 220° C. A toluene dispersion of the InP core nanocrystals thus prepared (optical density: 0.15) and 0.6 mmol S/TOP are added to the flask and the resulting mixture is heated to 280° C. The reaction is allowed to proceed for 30 minutes. After the reaction is ceased, the reaction solution is quickly cooled to room temperature to obtain a reaction mixture including InP/ZnS semiconductor nanocrystals.

(2) An excessive amount of ethanol is added to the reaction mixture including the InP/ZnS semiconductor nanocrystals, which is then subjected to centrifugation to remove excess organic material on the surface of the nanocrystals. After centrifugation, the supernatant is discarded and the precipitate obtained from the centrifugation is dried and dispersed in chloroform. A UV-vis absorption spectrum of the resulting dispersion is measured. The prepared nanocrystal emits red light or green light.

Example 1

Preparation of Polymer Composition and Natural Curing of Prepared Composition 100 parts by weight of a monomer mixture including pentaerythritol tetrakis(3-mercaptopropionate) (4T), tricyclodecane dimethanol diacrylate (A-DCP), and lauryl methacrylate (LMA) are prepared. The monomers are mixed in a mole ratio of 1:1.52 between a thiol group and an acrylate group in the monomer mixture. Then, 0.5 parts by weight of Irgacure 184 and 0.5 parts by weight of 2,4,6-trimethylbenzoyl-diphenyl-phosphine oxide (TPO) are added to 100 parts by weight of the monomer mixture. The finally obtained mixture is defoamed under vacuum.

Ascorbic acid, citric acid, zinc acetate, zinc stearate, $ZnF_2$, Zn metal, or indium acetate ($In(OAc)_3$) is added to the monomer mixture in an amount set forth in Table 1 per 100 parts by weight of the monomer mixture. In Table 1, the 184 and TPO as a photoinitiator respectively indicate Irgacure 184 and trimethylbenzoyl diphenyl phosphine oxide that is commercially available from BASF Co. Ltd.

Viscosity of the composition is measured at room temperature by using a viscometer (a 50 millimeters (mm) cone spindle, Anton Paar).

The composition is stored under conditions provided in Table 1.

After the storage, whether the composition is cured or not or whether the viscosity is changed or not, the appearance of the composition is examined, and the viscosity of the composition is measured by the above method. The results are compiled in Table 1.

TABLE 1

| Additive and amount (additive weight based on 100 parts by weight of resin composition) | | Initial viscosity | Storage condition | Changes of viscosity after storage |
|---|---|---|---|---|
| Ascorbic acid (1 part by weight) | | 120-130 cps | 20° C./ 12 hours | No changes of viscosity |
| Citric acid (1 part by weight) | | | | No changes of viscosity |
| Zn acetate | (1 part by weight) | | 40° C./ 34 hours | No changes of viscosity |
| | (0.03 parts by weight) | | | No changes of viscosity |
| | (0.01 part by weight) | | | 128 cps, No changes of viscosity |
| ZnO (0.5 to 1 part by weight) | | | 20° C./ 12 hours | No changes of viscosity |
| Zn stearate (0.03 parts by weight) | | | | 123 cps, No changes of viscosity |
| $ZnF_2$ (1 part by weight) | | | | No changes of viscosity |
| Zn metal (1 part by weight) | | | | No changes of viscosity |
| $Zn(Et)_2$ (1 part by weight) | | | | No changes of viscosity |
| $In(OAc)_3$ (1 part by weight) | | | | No changes of viscosity |
| Zinc acetate (0.02 parts by weight) | | | 40° C./ 54 hours | No changes of viscosity |

As shown in Table 1, when the above additive is added, a curing prevention effect is clearly found.

Comparative Example 1

Preparation of Polymer Composition and Evaluation as to Whether a Natural Curing Occurs for the Prepared Composition Acetic acid, oleic acid, stearic acid, palmitic acid, water, $ZnCl_2$, cadmium acetate, or copper acetate is added to the monomer mixture in an amount set forth in Table 2 per 100 parts by weight of the monomer mixture to provide a composition. In Table 2, the 184 and TPO as a photoinitiator respectively indicate Irgacure 184 and trimethylbenzoyl diphenyl phosphine oxide commercially available from BASF Co., Ltd.

Viscosity of the composition is measured at room temperature using a viscometer (a 50 mm cone spindle, Anton Paar).

The composition is stored under conditions set forth in Table 2.

After the storage, whether the composition is cured or not or whether the viscosity is changed or not is examined by observing appearance of the composition or measuring viscosity of the composition in the aforementioned method, and the results are compiled in Table 2.

TABLE 2

| Additive and amount (additive weight based on 100 parts by weight of resin composition) | Initial viscosity | Storage condition | Changes of viscosity after storage |
|---|---|---|---|
| $CH_3CO_2H$ (1 part by weight) | 120-130 centipoise (cps) | 20° C./12 hours | 538 cps, viscosity increase |
| Oleic acid (1 to 2 parts by weight) | | | Curing is processed |
| Steric acid (1 part by weight) | | | Curing is processed |
| Palmitic acid (1 part by weight) | | | Curing is processed |
| $H_2O$ (1 part by weight) | | | Curing initiates from the bottom |
| $ZnCl_2$ (0.0075 parts by weight) | | | Cured |
| $Cd(OAc)_2$ 1 part by weight | | | Curing is processed |
| $Cu(OAc)_2$ 1 part by weight | | | Curing is processed |

Referring to the results of Table 2, cadmium salt and copper salt have no curing prevention effect. In addition, zinc chloride has no curing prevention effect. Furthermore, fatty acids such as oleic acid, stearic acid, and palmitic acid have no curing prevention effect. In addition, water has no curing prevention effect.

Example 2

Determination of Causes of Curing Phenomenon of the Quantum Dot Polymer Composition and Effects of Curing Inhibiting Additives It is believed that a quantum dot polymer composition may undergo curing when the reactants used during quantum dot (QD) synthesis are not thoroughly removed in a separation process of the quantum dots (QD) via a non-solvent precipitation method. Examples of the unremoved reactant that may cause the curing may include trioctylphosphine (TOP) or sulfur-coordinated trioctylphosphine (S/TOP). The liquid chromatography-mass spectroscopy (LC-MS) analysis of a QD precipitate may confirm that the amount of the S/TOP remaining on the QDs tends to decrease as the number of precipitation/separation increases. To determine whether the curing is caused by the unremoved reactant, the following experiments are conducted: TOP or S/TOP is added to the monomer composition and the effect of a zinc compound on curing inhibition of the resulting composition is observed.

A composition including a monomer mixture of pentaerythritol tetrakis(3-mercaptopropionate) (4T), tricyclodecane dimethanol diacrylate (A-DCP), lauryl methacrylate (LMA), trimethylolpropane triacrylate (TMPTA), Irgacure 184, and 2,4,6-trimethylbenzoyl-diphenyl-phosphine oxide (TPO) is prepared. 2 parts by weight of an initiator is used based on 100 parts by weight of the monomer mixture. In the monomer mixture, the mole ratio of the thiol and the acrylate is thiol:acrylate=1:1.77. Then, TOP or a 2 molar (M) S/TOP solution obtained by dissolving sulfur in TOP is added to the monomer mixture in an amount of 0.01 mmol per 1 g of the total weight of the monomer mixture, to which zinc stearate is added in an amount set forth in Table 3.

Viscosity of the composition thus prepared is measured in the same manner set forth in Example 1.

Some compositions are cured immediately after the mixing process. The composition that does not show curing phenomenon directly after the mixing is stored under conditions set forth in Table 3, and then its viscosity is measured. The results for each composition are compiled in Table 3.

TABLE 3

| Curing components | Amount of zinc stearate relative to curing components (mole ratio) | Storage condition | Viscosity (cps) |
|---|---|---|---|
| TOP (trioctylphosphine) | 10 | room temperature/3 h | 171 |
| | | 40° C./85% RH/1 day | 226 |
| | 2.45 | Immediately when being mixed | Partial curing |
| | 1 | Immediately when being mixed | Curing |
| | 0.45 | Immediately when being mixed | Curing |
| 2M S/TOP | 0.45 | Room temperature/3 h | 130 |
| | | 40° C./85% RH/1 day | 175 |
| | 0.1 | room temperature/1 h | 160 |
| | 0.02 | Immediately when being mixed | Partial curing |

TABLE 3-continued

| Curing components | Amount of zinc stearate relative to curing components (mole ratio) | Storage condition | Viscosity (cps) |
|---|---|---|---|
| | 0.01 | Immediately when being mixed | Curing |

The results of Table 3 confirm that the curing may be inhibited with the increase in the amount of zinc stearate per the amount of the curing-causing component (i.e., TOP or 2 M S/TOP), which implies that the addition of the zinc compound may suppress the curing phenomenon caused by TOP or S/TOP being able to remain in a QD resin.

Example 3

Evaluation of the Influence of the Additives on Light Emitting Characteristics (in Case where the Curing Inhibitor is Added to a Filling Resin)

A mixture including pentaerythritol tetrakis(3-mercaptopropionate) (4T) as a first monomer, lauryl methacrylate (LMA) and tricyclodecane dimethanol diacrylate (A-DCP) as a second or a fourth monomer, and 0.5 parts by weight of Irgacure 184 and 0.5 parts by weight of 2,4,6-trimethylbenzoyl-diphenyl-phosphine oxide (TPO) as an initiator per 100 parts by weight of the mixture are mixed together to obtain a monomer mixture. The monomer mixture including 4T and (LMA+A-DCP) in a ratio of 3:7 is used as a Ref. composition, and a composition A is prepared by adding 200 parts per million (ppm) of zinc acetate based on 1 part by weight of the monomer mixture of 4T:(LMA+A-DCP) in a ratio of 3:7. The Ref. composition and the composition A are used as a filling resin composition in the manufacture of the QD film.

A monomer for a quantum dot resin is prepared by mixing 100 parts by weight of a mixture of pentaerythritol tetrakis (3-mercaptopropionate) (4T) as a first monomer, lauryl-methacrylate (LMA), trimethylolpropane triacrylate (TMPTA), and tricyclodecane dimethanol diacrylate (A-DCP) as a second or a fourth monomer (the mole ratio between the first monomer and the second and the fourth monomers=1:3), 1 part by weight of Irgacure 184 and 1 part by weight of 2,4,6-trimethylbenzoyl-diphenyl-phosphine oxide (TPO) as initiators, and 4 parts by weight of ZnO. A solution including the red light emitting InP/ZnS quantum dot or green light emitting InP/ZnS quantum dot (QD) each prepared in Reference Example 1 is added to acetone and ethanol to precipitate the QDs, which are then dried and added to the aforementioned monomer mixture in an appropriate manner (e.g., as a dispersion). The resulting mixture is vortexed to produce a quantum dot-containing composition (hereinafter, referred to as the quantum dot resin composition).

The quantum dot resin composition is coated on a soft mold to obtain a QD-containing monomer composition film, a barrier film (a silica-coated PET film) is formed thereon and compressed, and the QD-containing composition layer is cured by radiating UV rays (wavelength: less than or equal to 365 nm, intensity: 500 mJ/cm²), obtaining a quantum dot-resin composite. The quantum dot-resin composite is released from the soft mold as a layer attached on the barrier film. Then, the filling resin composition (i.e., the Ref. composition or composition A) is coated over the QD-resin composite layer and cured by UV irradiation (wavelength: less than or equal to 365 nm, intensity: 500 milliJoules (mJ)) to produce a quantum dot resin composite film coated with the filling resin. Another quantum dot resin composite film coated with the filling resin composition is manufactured in the same manner as set forth above. The two obtained films are integrated with each filling resin layer facing each other to produce a final QD film.

The obtained film (8×8 cm) is analyzed on a blue light source (a 60 inch TV panel) by using a spectroradiometer (CS-2000, Konica Minolta), and the results are shown in FIG. 3. Luminance value (Lv) of the film is measured at a color coordinate of Cy=0.24, and the results are provided in Table 4.

TABLE 4

| | Cy = 0.24 | | | |
|---|---|---|---|---|
| Application of filling resin Additive | Lv | Relative comparison | Cx | Cy |
| No additive (Comparative Example) | 340 | 100 | 0.2340 | 0.2400 |
| Zinc acetate 200 ppm (composition A) | 332 | 98 | 0.2341 | 0.2400 |

Referring to FIG. 3 and Table 4, the brightness (the luminance value) of the film manufactured by using composition A including an additive as a filling resin and the brightness of the film manufactured by using a composition including no additive show no substantial difference.

Example 4

Evaluation of the Influence of the Additives on Light Emitting Characteristics (in Case where the Curing Inhibitor is Added to a QD Resin)

100 parts by weight of a mixture including pentaerythritol tetrakis(3-mercaptopropionate) (4T) as a first monomer, laurylmethacrylate (LMA) and tricyclodecane dimethanol diacrylate (A-DCP) as a second or fourth monomer, and 0.5 parts by weight of Irgacure 184 and 0.5 parts by weight of 2,4,6-trimethylbenzoyl-diphenyl-phosphine oxide (TPO) as initiators are mixed and the resulting mixture is used as a filling resin composition.

A quantum dot resin composition is prepared to include 100 parts by weight of a monomer mixture including pentaerythritol tetrakis(3-mercaptopropionate) (4T) as a first monomer and lauryl methacrylate (LMA), trimethylolpropane triacrylate (TMPTA), and tricyclodecane dimethanol diacrylate (A-DCP) as a second or fourth monomer (at a ratio of the first monomer and the second and the fourth monomers=1:3), 1 part by weight of Irgacure 184 and 1 part by weight of 2,4,6-trimethylbenzoyl-diphenyl-phosphine oxide (TPO) as initiators together with 4 parts by weight of $ZnO_2$.

A solution including the red light emitting InP/ZnS quantum dot or the green light emitting InP/ZnS quantum dot (QD) each prepared in Reference Example 1 is added to acetone and ethanol to precipitate the QDs, which are then dried and added to the aforementioned quantum dot resin composition in an appropriate manner (e.g., as a dispersion). The resulting mixture is vortexed to produce a quantum dot-containing composition (hereinafter, referred to as the Ref. quantum dot resin composition).

Quantum dot-containing composition A is prepared in substantially the same manner as the method of manufacturing the Ref. quantum dot-containing composition, except that 0.63 parts by weight of zinc stearate is added per 100 parts by weight of the monomer mixture.

Quantum dot-containing composition B substantially the same manner as the method of manufacturing the Ref. quantum dot-containing composition, except that 0.26 parts by weight of indium acetate is added per 100 parts by weight of the monomer mixture.

Figure 4:
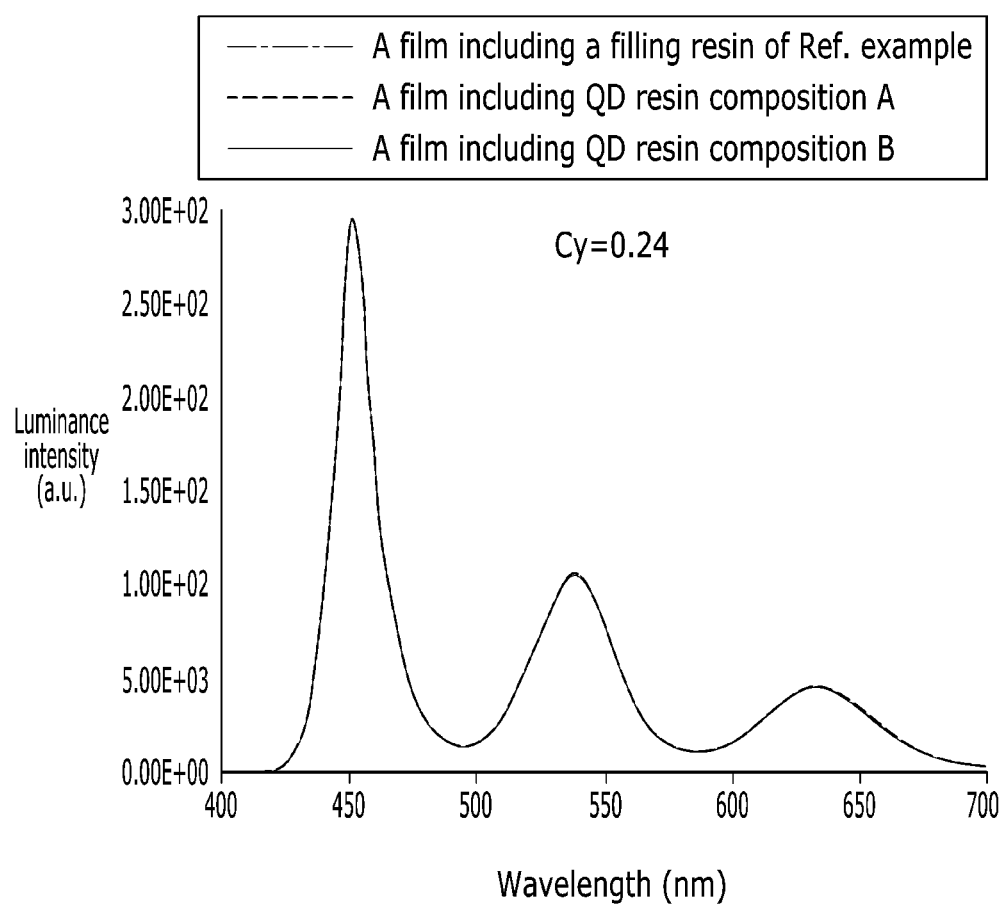
FIG. 4 is a graph of luminescence intensity (arbitrary units, a. u.) versus wavelength (nanometer, nm), showing the result of Example 5.

The filling resin composition is commonly used and each of the Ref. quantum dot resin composition, Quantum dot-containing composition A, and Quantum dot-containing composition B is used to manufacture a QD film in the same manner as set forth in Example 3. The obtained QD film (8×8 centimeters (cm)) is analyzed on a blue light source (a 60 inch TV panel) using a Spectroradiometer (CS-2000, Konica Minolta), and the results are shown in FIG. 4. The luminance value (Lv) of the film is measured at a color coordinate Cy=0.24, and the results are compiled in Table 5.

TABLE 5

| | | Cy = 0.24 | | |
|---|---|---|---|---|
| | Lv | Relative comparison | Cx | Cy |
| Ref. QD film using quantum dot resin composition | 341 | 100 | 0.2287 | 0.2400 |
| QD film using quantum dot resin composition A | 336 | 99 | 0.2298 | 0.2399 |
| QD film using quantum dot resin composition B | 345 | 101 | 0.2273 | 0.2399 |

The results of FIG. 4 and Table 5 confirm that the films manufactured by using Quantum dot resin composition A including an additive and Quantum dot resin composition B including an additive show a luminance value that is substantially the same as that of the film manufactured by using the Ref. quantum dot resin composition.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A composition comprising:
    a monomer mixture comprising a first monomer comprising at least two thiol groups at a terminal end thereof and a second monomer comprising at least two carbon-carbon unsaturated bond-containing groups at a terminal end thereof;
    a light emitting particle selected from the group consisting of a Group II-VI compound semiconductor nanocrystal, a Group III-V compound semiconductor nanocrystal, a Group IV-VI compound semiconductor nanocrystal, and a Group IV compound semiconductor nanocrystal; and
    at least one additive selected from the group consisting of a zinc compound, an indium compound, ascorbic acid or a salt thereof, citric acid or a salt thereof, a tocopherol, and a tocotrienol.

2. The composition of claim 1, further comprising at least one light emitting particle selected from the group consisting of a metal nanocrystal, a metal oxide nanocrystal, a phosphor, and a pigment.

3. The composition of claim 1, wherein the first monomer is represented by Chemical Formula 1:

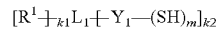  Chemical Formula 1 wherein, in Chemical Formula 1,
$R^1$ is selected from the group consisting of hydrogen; a substituted or unsubstituted C1 to C30 linear or branched alkyl group; a substituted or unsubstituted C6 to C30 aryl group; a substituted or unsubstituted C7 to C30 arylalkyl group; a substituted or unsubstituted C3 to C30 heteroaryl group; a substituted or unsubstituted C4 to C30 heteroarylalkyl group; a substituted or unsubstituted C3 to C30 cycloalkyl group; a substituted or unsubstituted C3 to C30 heterocycloalkyl group; a C1 to C10 alkoxy group; a hydroxy group; —NH$_2$; —NRR', wherein R and R' are independently hydrogen or a C1 to C30 linear or branched alkyl group; an isocyanate group; a halogen; —ROR', wherein R is a substituted or unsubstituted C1 to C20 alkylene group and R' is hydrogen or a C1 to C20 linear or branched alkyl group; —RC(=O)X, wherein R is a substituted or unsubstituted alkylene group and X is a halogen; —C(=O)OR', wherein R' is hydrogen or a C1 to C20 linear or branched alkyl group; —CN; and —C(=O)ONRR', wherein R and R' are independently hydrogen or a C1 to C20 linear or branched alkyl group,
$L_1$ is selected from the group consisting of a carbon atom, a substituted or unsubstituted C1 to C30 alkylene group, a substituted or unsubstituted C6 to C30 cycloalkylene group, a substituted or unsubstituted C6 to C30 arylene group, or a substituted or unsubstituted C6 to C30 heteroarylene group, and a C1 to C30 alkylene group, wherein at least one non-adjacent —CH$_2$— group is replaced by —SO$_2$—, —C(=O)—, —O—, —S—, —SO—, —C(=O)O—, —C(=O)NR—, wherein R is hydrogen or a C1 to C10 alkyl group, or a combination thereof,
$Y_1$ is selected from the group consisting of a single bond; a substituted or unsubstituted C1 to C30 alkylene group; a substituted or unsubstituted C2 to C30 alkenylene group; and a substituted C1 to C30 alkylene group or a C2 to C30 alkenylene group, wherein at least one —CH$_2$— group is replaced by —S(=O)$_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, or a combination thereof,
m is an integer of 1 or more,
k1 is 0 or an integer of 1 or more,
k2 is an integer of 1 or more,
wherein the sum of m and k2 is an integer of 3 or more, provided that m does not exceed the valence of $Y_1$, and provided that the sum of k1 and k2 does not exceed the valence of $L_1$.

4. The composition of claim 1, wherein the second monomer is represented by Chemical Formula 2:

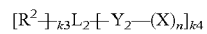  Chemical Formula 2 wherein, in Chemical Formula 2,

X is selected from the group consisting of an aliphatic organic group comprising a carbon-carbon double bond or a carbon-carbon triple bond, an aromatic organic group comprising a carbon-carbon double bond or a carbon-carbon triple bond, and an alicyclic organic group comprising a carbon-carbon double bond or a carbon-carbon triple bond, $R^2$ is selected from the group consisting of hydrogen; a substituted or unsubstituted C1 to C30 linear or branched alkyl group; a substituted or unsubstituted C6 to C30 aryl group; a substituted or unsubstituted C7 to C30 arylalkyl group; a substituted or unsubstituted C3 to C30 heteroaryl group; a substituted or unsubstituted C3 to C30 heteroarylalkyl group; a substituted or unsubstituted C3 to C30 cycloalkyl group; a substituted or unsubstituted C3 to C30 heterocycloalkyl group; a C1 to C10 alkoxy group; a hydroxy group; $NH_2$; —NRR', wherein R and R' are independently hydrogen or a C1 to C30 linear or branched alkyl group; an isocyanate group; a halogen; —ROR', wherein R is a substituted or unsubstituted C1 to C20 alkylene group and R' is hydrogen or a C1 to C20 linear or branched alkyl group; —RC(=O)X, wherein R is a substituted or unsubstituted alkylene group and X is a halogen; —C(=O)OR', wherein R' is hydrogen or a C1 to C20 linear or branched alkyl group; —CN; and —C(=O)ONRR', wherein R and R' are independently hydrogen or a C1 to C20 linear or branched alkyl group, $L_2$ is selected from the group consisting of a carbon atom, a substituted or unsubstituted C1 to C30 alkylene group, a substituted or unsubstituted C6 to C30 cycloalkylene group, a substituted or unsubstituted C6 to C30 arylene group, and a substituted or unsubstituted C3 to C30 heteroarylene group, $Y_2$ is selected from the group consisting of a single bond; a substituted or unsubstituted C1 to C30 alkylene group; a substituted or unsubstituted C2 to C30 alkenylene group; and a substituted C1 to C30 alkylene group or a C2 to C30 alkenylene group, wherein at least one —$CH_2$— group is replaced by —S(=O)$_2$—, —C(=O)—, —O—, —S—, —S(=O)—, —C(=O)O—, —C(=O)NR—, wherein R is hydrogen or a C1 to C10 linear or branched alkyl group, and —NR—, wherein R is hydrogen or a C1 to C10 linear or branched alkyl group, or a combination thereof, n is an integer of 1 or more, k3 is an integer of 0 or more, k4 is an integer of 1 or more, wherein the sum of n and k4 is an integer of 3 or more, provided that n does not exceed the valence of $Y_2$, and provided that the sum of k3 and k4 does not exceed the valence of $L_2$.

5. The composition of claim 2, wherein the first monomer of Chemical Formula 1 comprises a monomer of Chemical Formula 1-1:

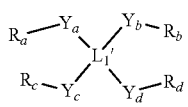

Chemical Formula 1-1 wherein, in Chemical Formula 1-1,

L1' is selected from the group consisting of carbon; a substituted or unsubstituted C6 to C30 tetravalent arene-derived group; a substituted or unsubstituted C3 to C30 tetravalent heteroarene-derived group; a substituted or unsubstituted C3 to C30 tetravalent cycloalkane-derived group; and a substituted or unsubstituted C3 to C30 heterocycloalkane-derived group, each of $Y_a$ to $Y_d$ is independently selected from the group consisting of a single bond; a substituted or unsubstituted C1 to C30 alkylene group; a substituted or unsubstituted C2 to C30 alkenylene group; and a C1 to C30 alkylene group or a C2 to C30 alkenylene group, wherein at least one —$CH_2$— group is replaced by —S(=O)$_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, or a combination thereof, and $R_a$ to $R_d$ are each independently selected from the group consisting of $R^1$ of Chemical Formula 1 and SH, provided that at least two groups selected from $R_a$ to $R_d$ are SH.

6. The composition of claim 5, wherein the first monomer of Chemical Formula 1 is at least one selected from the group consisting of trimethylolpropane tris(3-mercaptopropionate) of Chemical Formula 1-2, pentaerythritol tetrakis(3-mercaptopropionate) of Chemical Formula 1-3, pentaerythritol tetrakis(2-mercaptoacetate) of Chemical Formula 1-4, tris[2-(3-mercaptopropinonyloxy)alkyl]isocyanurate of Chemical Formula 1-5, a compound of Chemical Formula 1-6, a compound of Chemical Formula 1-7, and a compound of Chemical Formula 1-8:

Chemical Formula 1-2

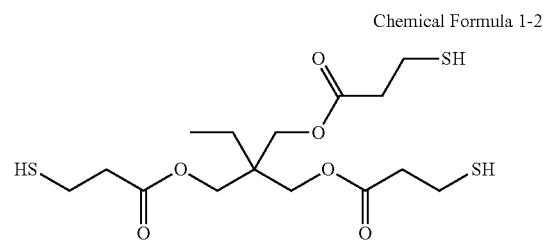

Chemical Formula 1-3

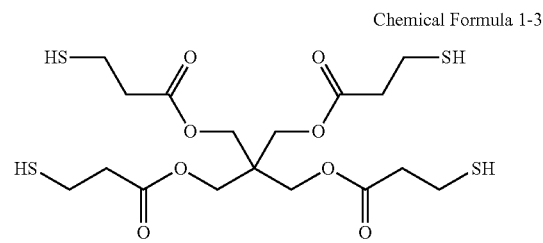

Chemical Formula 1-4

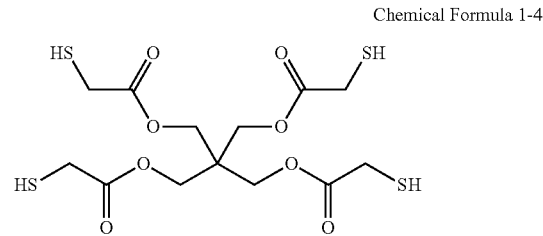

-continued

Chemical Formula 1-5

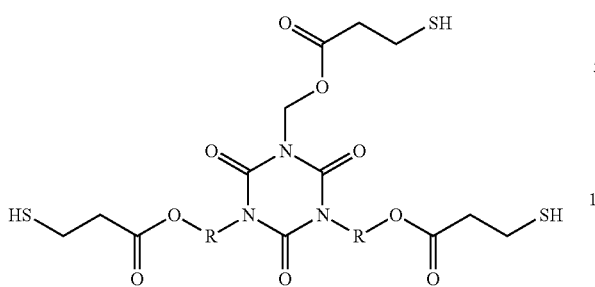

wherein, in Chemical Formula 1-5, R is a substituted or unsubstituted C1 to C10 alkylene;

Chemical Formula 1-6

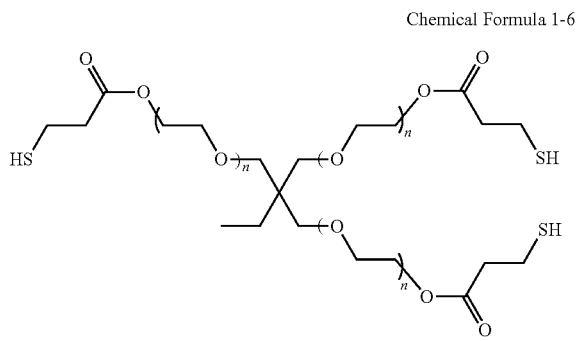

wherein n is an integer of 1 to 20;

Chemical Formula 1-7

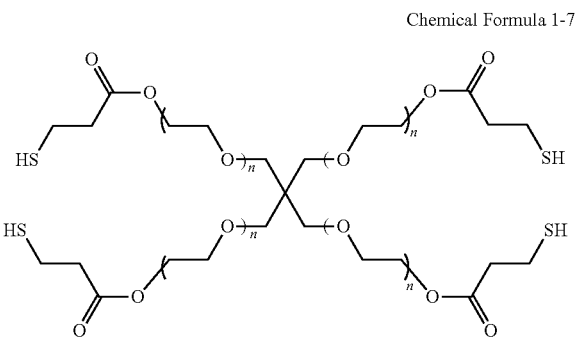

wherein n is an integer of 1 to 20; and

7. The composition of claim 4, wherein, in Chemical Formula 2,

X is selected from the group consisting of an acrylate group; a methacrylate group; a C2 to C30 alkenyl group; a C2 to C30 alkynyl group; a substituted or unsubstituted C3 to C30 alicyclic organic group having a carbon-carbon double bond or a carbon-carbon triple bond in the ring; a substituted or unsubstituted C3 to C30 heterocycloalkyl group having a carbon-carbon double bond or a carbon-carbon triple bond in the ring; a C3 to C30 alicyclic organic group substituted with a C2 to C30 alkenyl group or a C2 to C30 alkynyl group; and a C3 to C30 heterocycloalkyl group substituted with a C2 to C30 alkenyl group or a C2 to C30 alkynyl group.

8. The composition of claim 7, wherein the substituted or unsubstituted C3 to C30 alicyclic organic group comprising a carbon-carbon double bond or a carbon-carbon triple bond in the ring is selected from the group consisting of a norbornene group, a maleimide group, a nadimide group, and a tetrahydrophthalimide group.

9. The composition of claim 4, wherein the second monomer is at least one selected from the group consisting of a C4 to C100 diallyl compound, a C4 to C100 triallyl compound, a C4 to C100 diallyl ether compound, a C4 to C100 triallyl ether compound, a C4 to C100 di(meth)acrylate compound, a C4 to C100 tri(meth)acrylate compound, and a C4 to C100 divinyl ether compound.

10. The composition of claim 4, wherein in Chemical Formula 2, $L^2$ is selected from the group consisting of a group comprising a pyrrolidine moiety, a tetrahydrofuran moiety, a pyridine moiety, a pyrimidine moiety, a piperidine moiety, a triazine moiety, and an isocyanurate moiety.

11. The composition of claim 4, wherein the second monomer of Chemical Formula 2 is selected from the group consisting of a compound represented by Chemical Formula 2-1, a compound represented by Chemical Formula 2-2, and a compound represented by Chemical Formula 2-3:

Chemical Formula 2-1

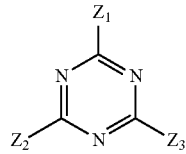

Chemical Formula 1-8

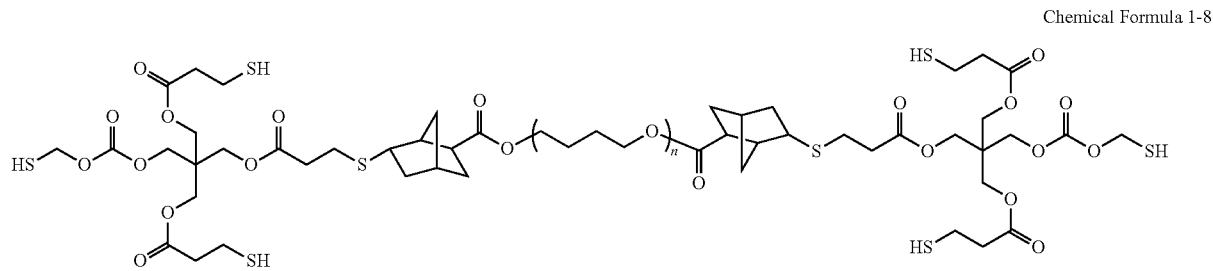

wherein n is an integer of 1 to 20.

-continued

Chemical Formula 2-2

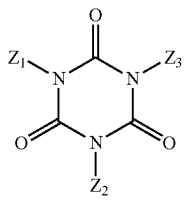

wherein, in Chemical Formulae 2-1 and 2-2,
each of $Z_1$ to $Z_3$ are independently *—$Y_2$—$X_n$ as defined in Chemical Formula 2;

Chemical Formula 2-3

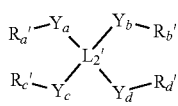

wherein, in Chemical Formula 2-3,
$L_2'$ is selected from the group consisting of carbon; a substituted or unsubstituted C1 to C30 tetravalent alkane-derived group; a substituted or unsubstituted C2 to C30 tetravalent alkene-derived group; a C1 to C30 tetravalent alkyne-derived group, wherein at least one —$CH_2$— group is replaced by —$S(=O)_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, a C6 to C10 cycloalkylene group, or a combination thereof; a C2 to C30 tetravalent alkene-derived group, wherein at least one —$CH_2$— group is replaced by —$S(=O)_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, a C6 to C10 cycloalkylene group, or a combination thereof; a substituted or unsubstituted C6 to C30 tetravalent arene-derived group; a substituted or unsubstituted C3 to C30 tetravalent heteroarene-derived group; a substituted or unsubstituted C3 to C30 tetravalent cycloalkane-derived group; and a substituted or unsubstituted C3 to C30 derived heterocycloalkane-derived group,
each of $Y_a$ to $Y_d$ is independently selected from the group consisting of a single bond; a substituted or unsubstituted C1 to C30 alkylene group; a substituted or unsubstituted C2 to C30 alkenylene group; and a C1 to C30 alkylene group or a C2 to C30 alkenylene group, wherein at least one —$CH_2$— group is replaced by —$S(=O)_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, or a combination thereof, and
$R'_a$ to $R'_d$ are $R^2$ of Chemical Formula 2 or X of Chemical Formula 2, provided that at least two groups selected from the group consisting of $R'_a$ to $R'_d$ are X of Chemical Formula 2.

12. The composition of claim 4, wherein the second monomer comprises at least one selected from the group consisting of a compound of Chemical Formula 2-4, a compound of Chemical Formula 2-5, a compound of Chemical Formula 2-6, a compound of Chemical Formula 2-7, a compound of Chemical Formula 2-8, a compound of Chemical Formula 2-9, a compound of Chemical Formula 2-10, a compound of Chemical Formula 2-11, a compound of Chemical Formula 2-12, a compound of Chemical Formula 2-13, a compound of Chemical Formula 2-14, and a compound of Chemical Formula 2-15:

Chemical Formula 2-4

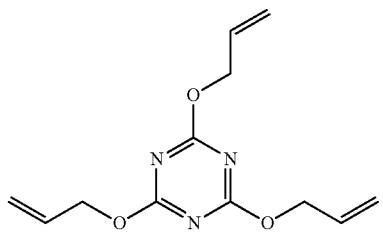

Chemical Formula 2-5

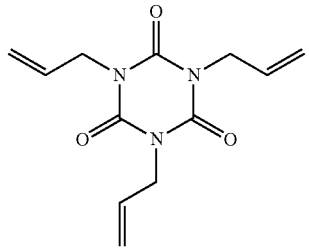

Chemical Formula 2-6

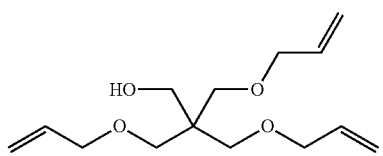

Chemical Formula 2-7

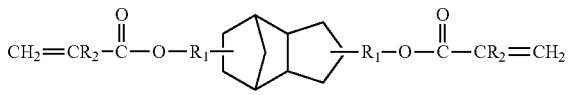

wherein, in Chemical Formula 2-7,
$R_1$ is selected from the group consisting of a C1 to C20 alkylene group and a C1 to C20 alkylene group, wherein at least one —$CH_2$— group is replaced by —$S(=O)_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, or a combination thereof, and
$R_2$ is selected from the group consisting of hydrogen and a methyl group;

Chemical Formula 2-8

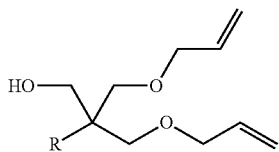

wherein, in Chemical Formula 2-8, R is a C1 to C10 alkyl group;

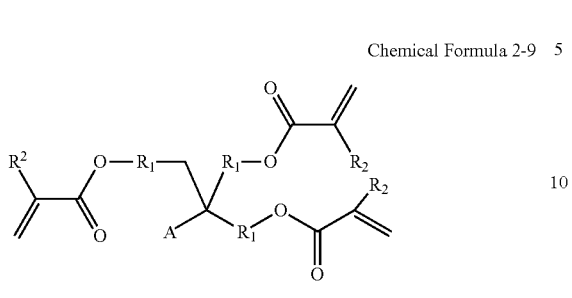

Chemical Formula 2-9 wherein, in Chemical Formula 2-9,
A is a C1 to C10 alkyl group or a hydroxy group,
R$_1$ is selected from the group consisting of a single bond, a C1 to C20 alkylene group, and a C1 to C20 alkylene, wherein at least one —CH$_2$— group is replaced by —S(=O)$_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, or a combination thereof, and
R$_2$ is selected from the group consisting of hydrogen and a methyl group;

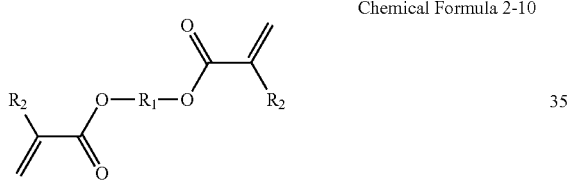

Chemical Formula 2-10 wherein, in Chemical Formula 2-10,
R$_1$ is selected from the group consisting of a single bond, a C1 to C20 alkylene, and a C1 to C20 alkylene, wherein at least one —CH$_2$— group is replaced by —S(=O)$_2$—, —C(=O)—, —O—, —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, or a combination thereof, and
R$_2$ is selected from the group consisting of hydrogen and a methyl group;

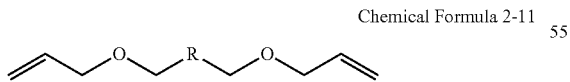

Chemical Formula 2-11 wherein, in Chemical Formula 2-11,
R is selected from the group consisting of a single bond and a C1 to C20 alkylene or a C1 to C20 alkylene, wherein at least one —CH$_2$— group is replaced by —S(=O)$_2$—, —C(=O)—, —O), —S—, —S(=O)—, —C(=O)O—, —C(=O)NR—, wherein R is hydrogen or a C1 to C10 linear or branched alkyl group, —NR—, wherein R is hydrogen or a C1 to C10 linear or branched alkyl group, or a combination thereof,

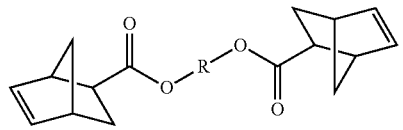

Chemical Formula 2-12 wherein, in Chemical Formula 2-12,
R is a C1 to C20 alkylene or a C1 to C20 alkylene, wherein at least one —CH$_2$— group is replaced by —S(=O)$_2$—, —C(=O)—, —O—, —S—, —S(=O)—, —C(=O)O—, —C(=O)NR—, wherein R is hydrogen or a C1 to C10 linear or branched alkyl group), —NR—, wherein R is hydrogen or a C1 to C10 linear or branched alkyl group, or a combination thereof,

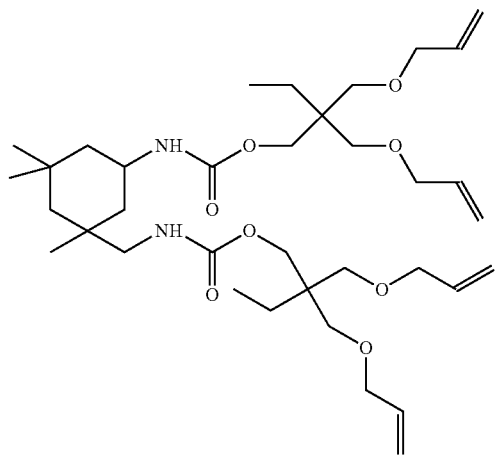

Chemical Formula 2-13

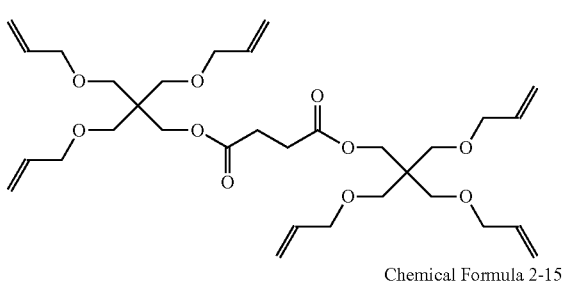

Chemical Formula 2-14

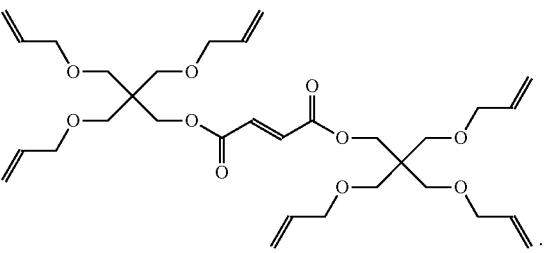

Chemical Formula 2-15

13. The composition of claim 1, wherein the monomer mixture further comprises at least one of a third monomer having one thiol group at a terminal end thereof and a fourth monomer having one carbon-carbon unsaturated bond-containing group at a terminal end thereof.

14. The composition of claim 1, wherein the zinc compound comprises at least one selected from the group consisting of a zinc inorganic acid salt comprising a counter ion with a pKa of at least 3, a zinc halide, a zinc oxide, a zinc organic acid salt, a zinc metal, and a dialkyl zinc, and the indium compound comprises at least one selected from the group consisting of an indium inorganic salt comprising a counter ion with a pKa of at least 3, an indium halide, an indium oxide, an indium organic acid salt, an indium metal, and a dialkyl indium.

15. The composition of claim 1, wherein the composition comprises the additive in an amount of about $10^{-6}$ parts by weight to about 10 parts by weight based on 100 parts by weight of the monomer mixture.

16. The composition of claim 1, wherein the composition comprises the light emitting particle in an amount of about 0.1 to about 20 parts by weight based on 100 parts by weight of the monomer mixture.

17. The composition of claim 1, wherein in the monomer mixture, the first monomer and the second monomer are present in such amounts that a mole ratio of the thiol group of the first monomer and the carbon-carbon unsaturated bond of the second monomer is about 1:about 0.75 to about 3.

\* \* \* \* \*